US007932151B2

(12) United States Patent
Sugioka

(10) Patent No.: US 7,932,151 B2
(45) Date of Patent: Apr. 26, 2011

(54) SEMICONDUCTOR DEVICE AND METHOD OF MANUFACTURING THE SAME

(75) Inventor: Shigeru Sugioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/537,356

(22) Filed: Aug. 7, 2009

(65) Prior Publication Data

US 2010/0044787 A1 Feb. 25, 2010

(30) Foreign Application Priority Data

Aug. 19, 2008 (JP) ................................. 2008-210556

(51) Int. Cl.
*H01L 21/336* (2006.01)
(52) U.S. Cl. .................................. 438/270; 257/E21.41
(58) Field of Classification Search .................. 438/270; 257/E21.41
See application file for complete search history.

(56) References Cited

U.S. PATENT DOCUMENTS

2005/0285175 A1* 12/2005 Cheng et al. .................. 257/302
2009/0101971 A1* 4/2009 Kujirai .......................... 257/330

FOREIGN PATENT DOCUMENTS

JP      2007-158269      6/2007

* cited by examiner

*Primary Examiner* — Alexander G Ghyka
*Assistant Examiner* — Seahvosh J Nikmanesh
(74) *Attorney, Agent, or Firm* — Young & Thompson

(57) ABSTRACT

A method of manufacturing a semiconductor device includes the following processes. A first gate trench is formed if a semiconductor substrate region. Then a first insulating film is formed to cover bottom and side surfaces of the first gate trench. Then, the first insulating film is removed to cover the bottom surface. Then, the semiconductor substrate region exposed to the first gate trench is etched by the first insulating film covering the side surfaces as a mask, to form, in the semiconductor substrate region, a second gate trench directly below the first gate trench. The second gate trench is defined by an unetched film portion of the semiconductor substrate region. The unetched film portion extends toward one of the side surfaces of the first gate trench.

17 Claims, 24 Drawing Sheets

CROSS SECTION
TAKEN ALONG LINE C-C'

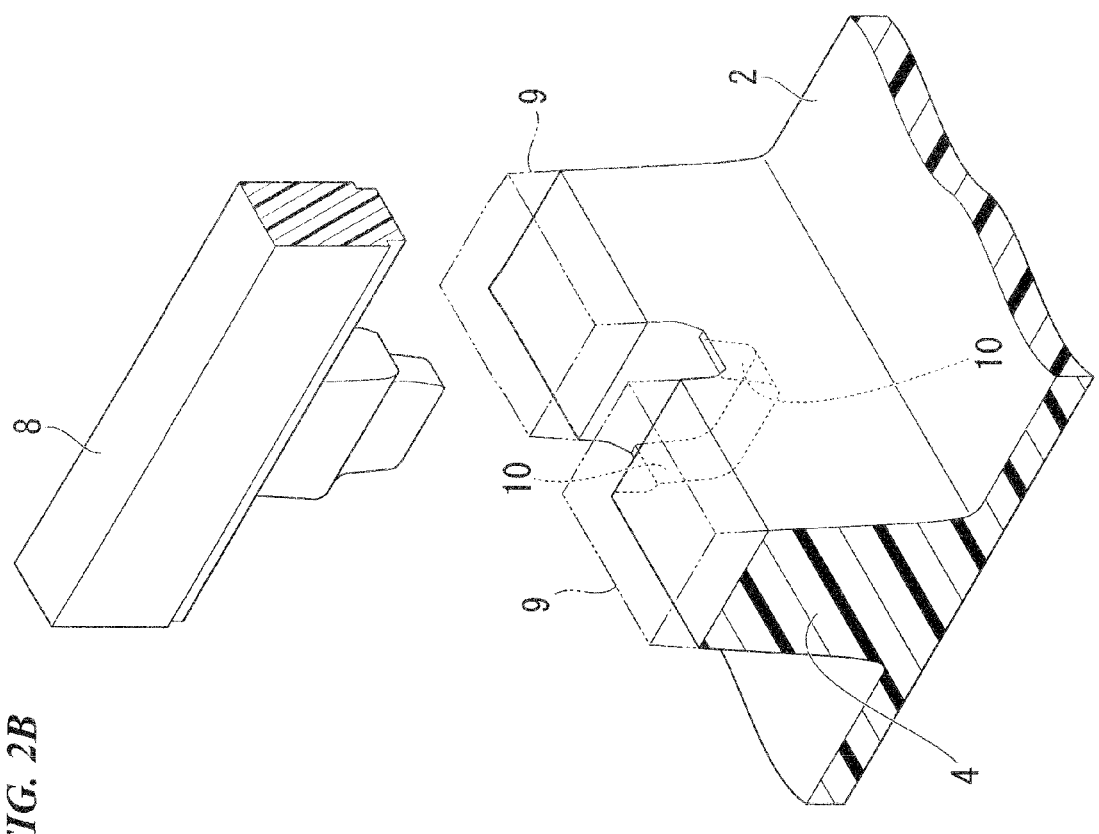
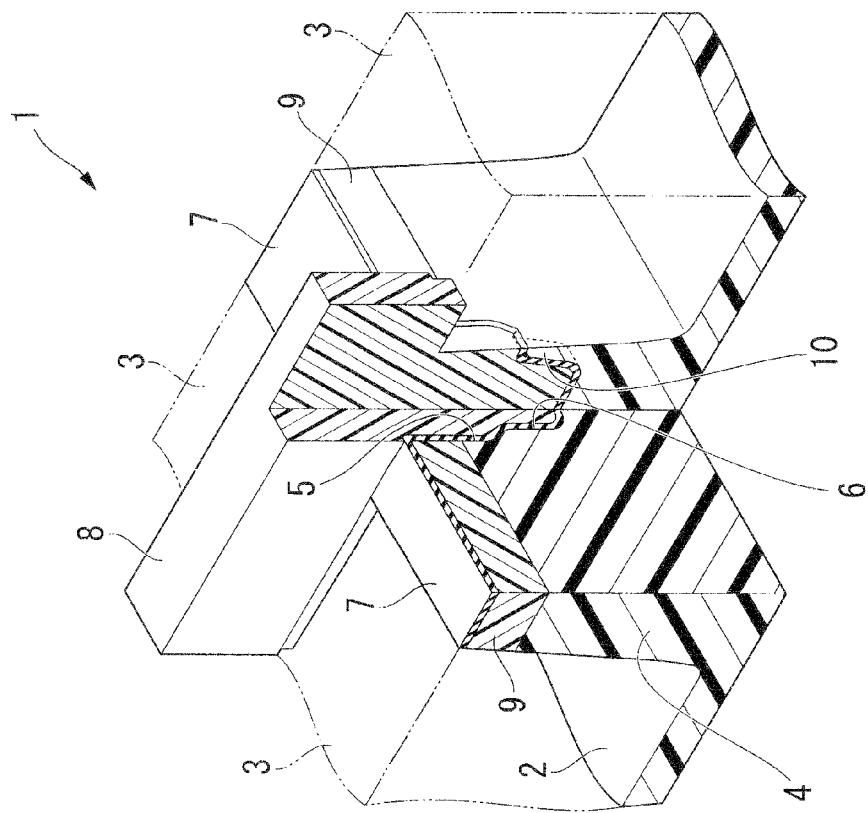

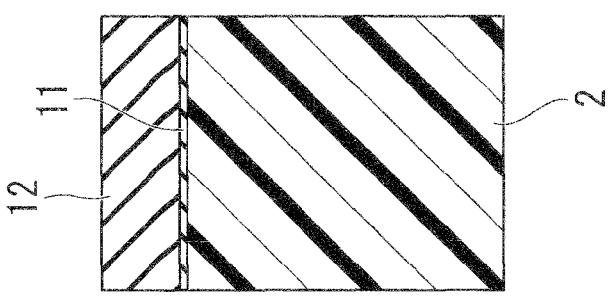
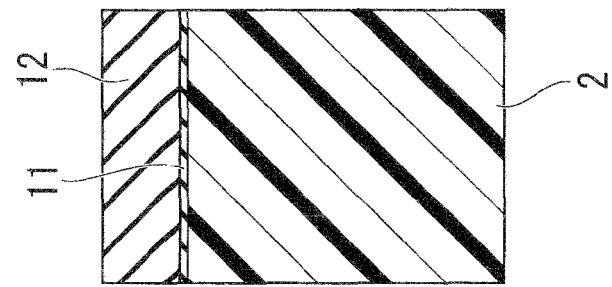
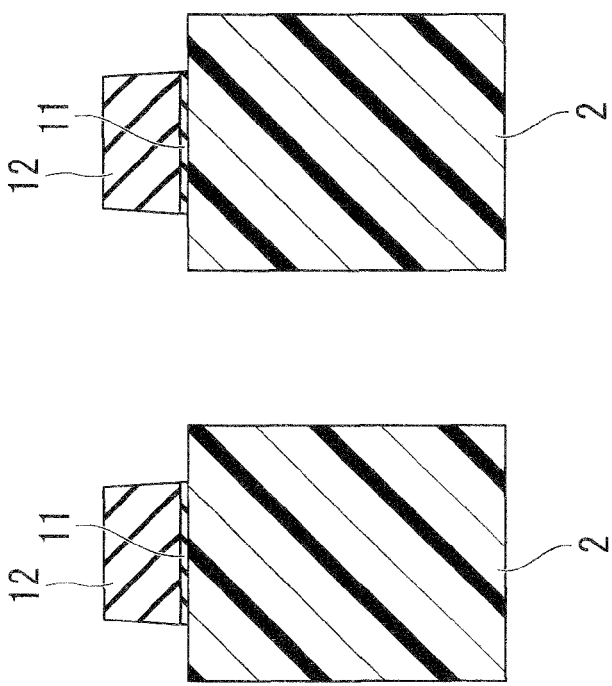

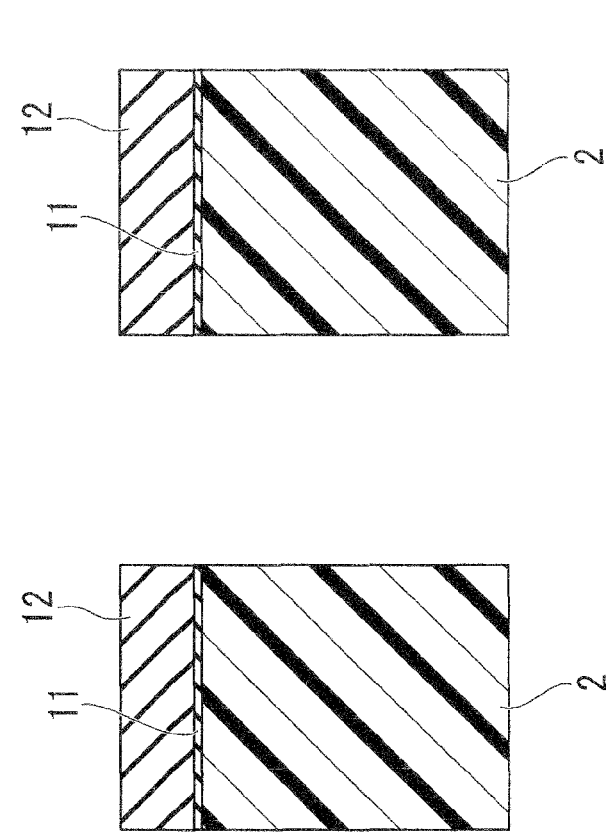

CROSS SECTION TAKEN ALONG LINE A-A'

CROSS SECTION TAKEN ALONG LINE B-B'

CROSS SECTION TAKEN ALONG LINE C-C'

PERIPHERAL CIRCUIT REGION

CROSS SECTION TAKEN ALONG LINE A-A'

CROSS SECTION TAKEN ALONG LINE B-B'

CROSS SECTION TAKEN ALONG LINE C-C'

PERIPHERAL CIRCUIT REGION

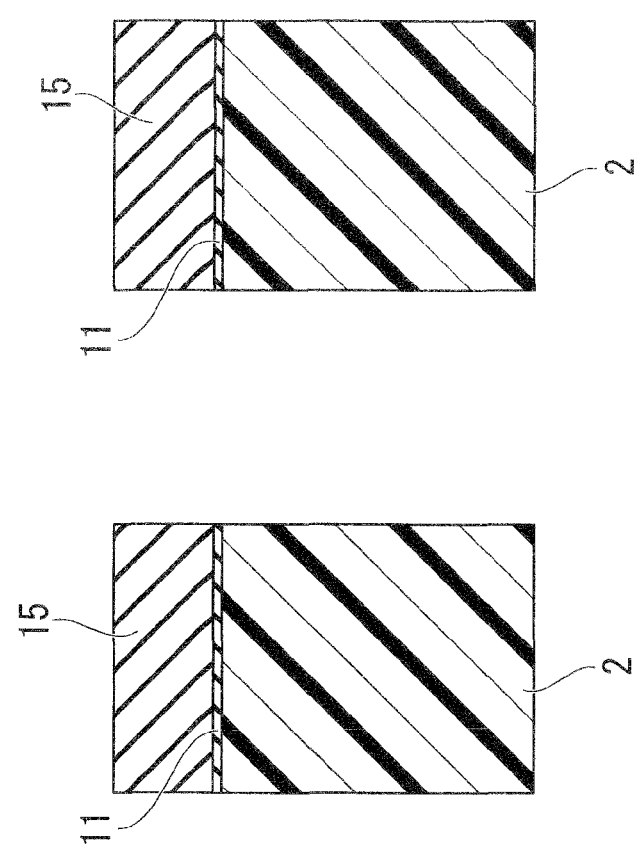
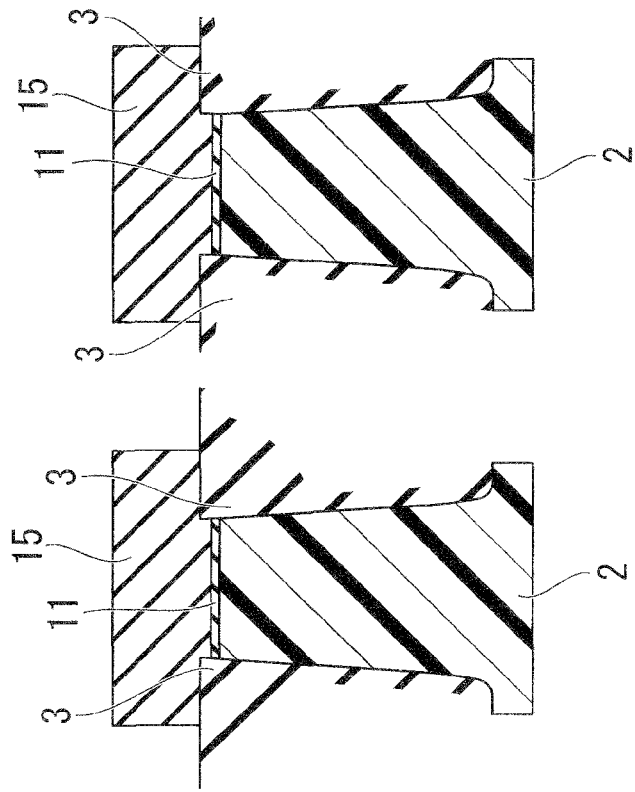

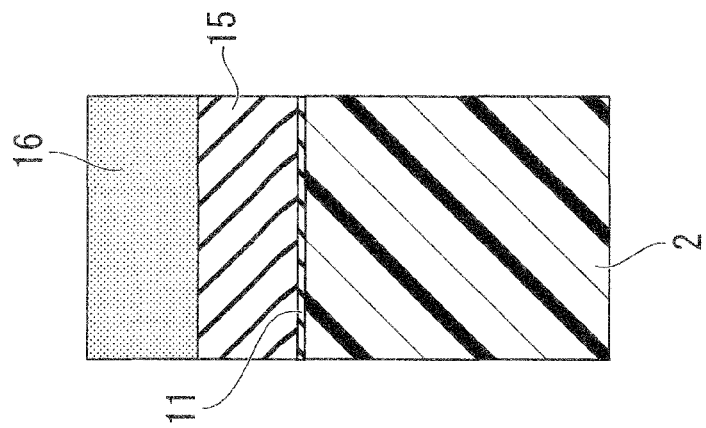
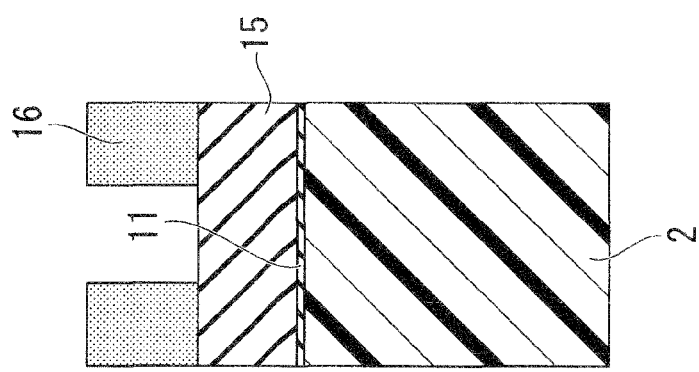
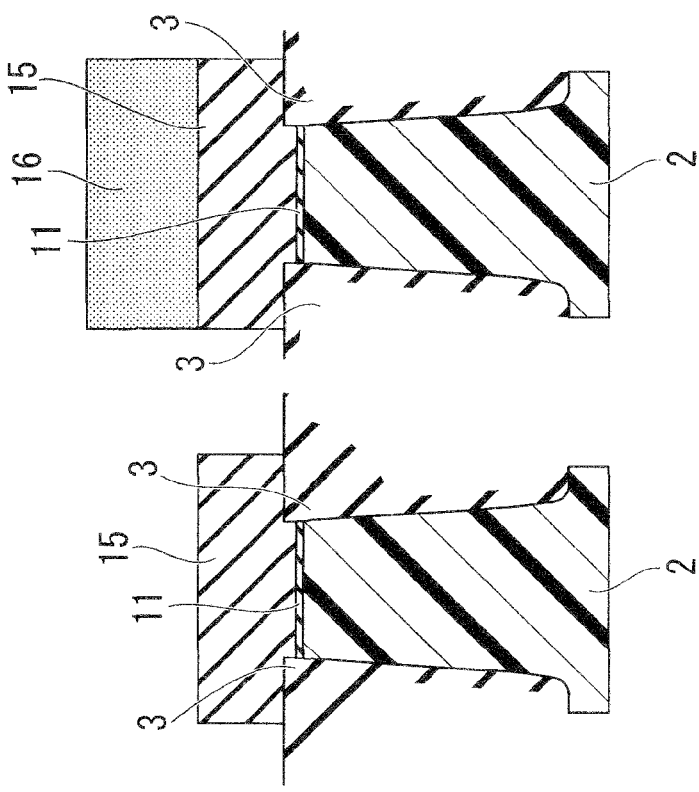

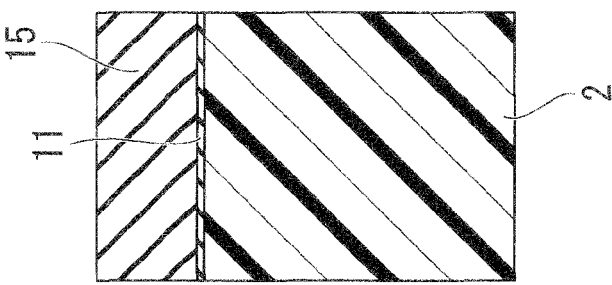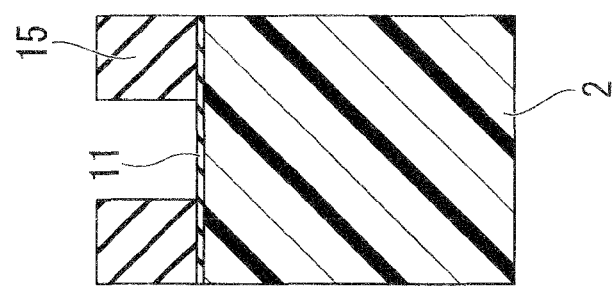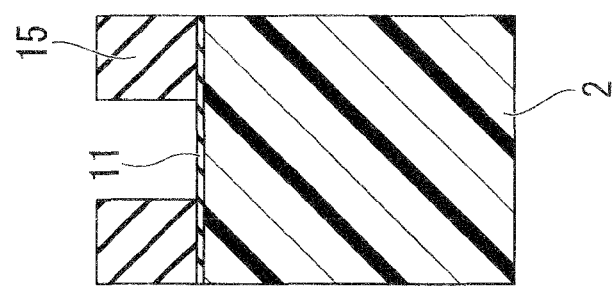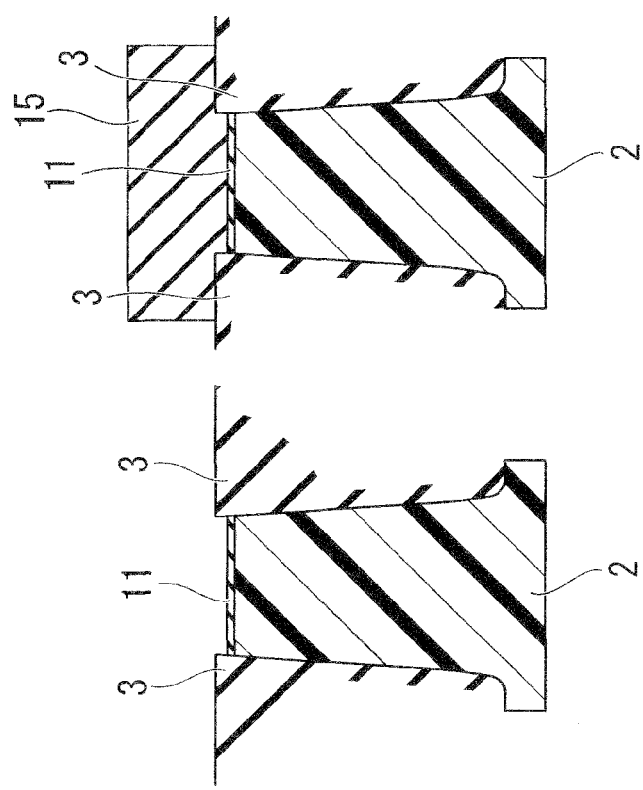

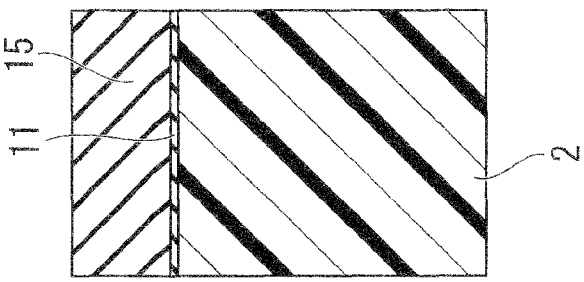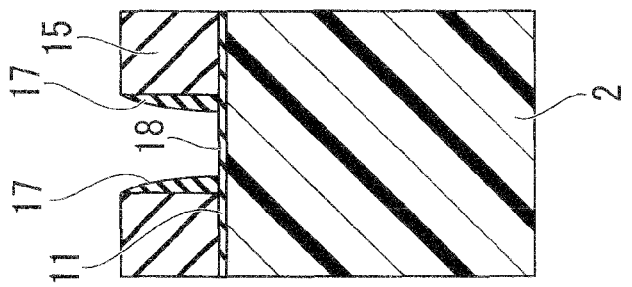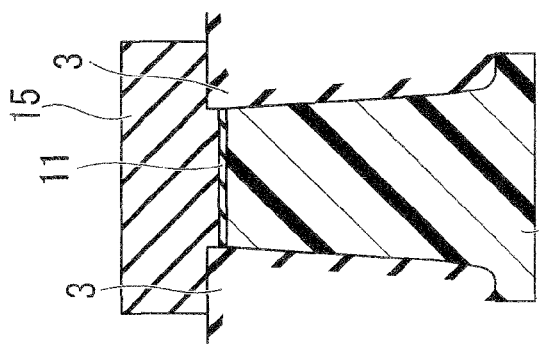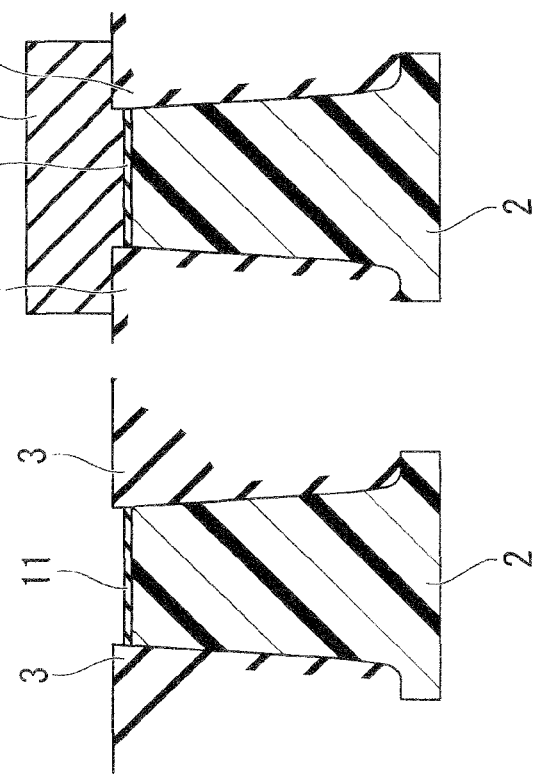

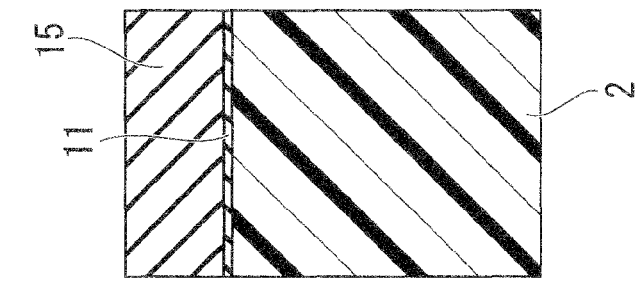
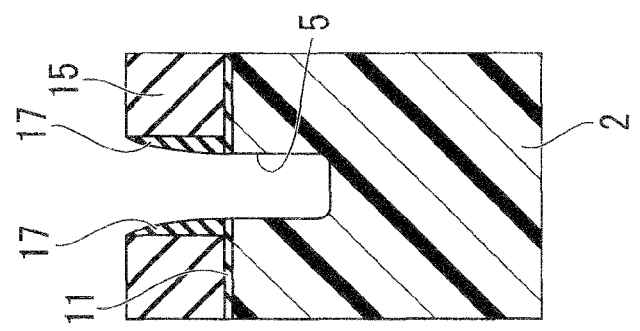
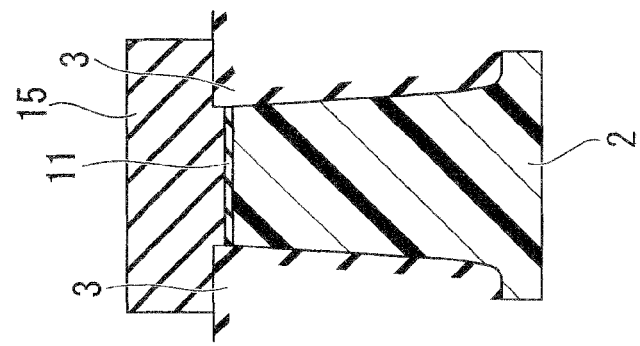
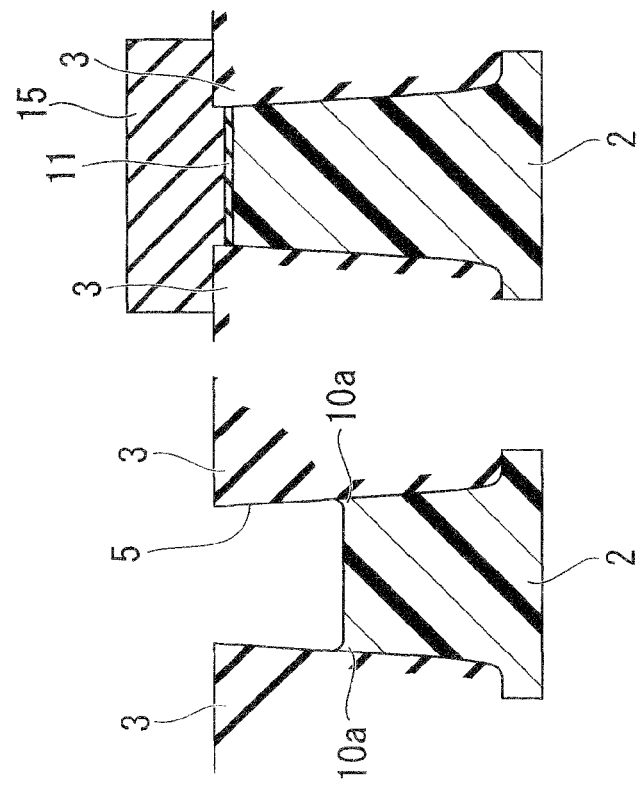

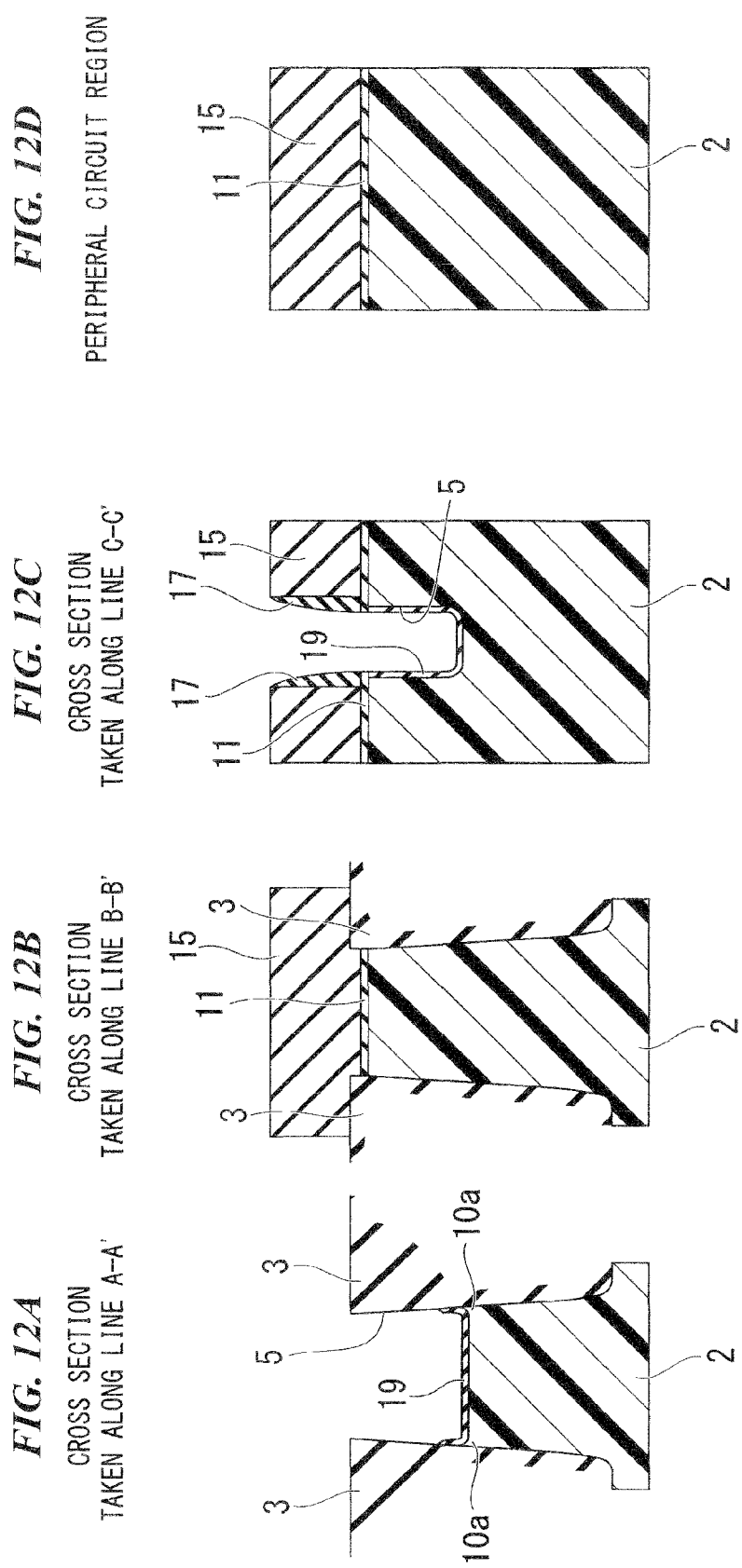

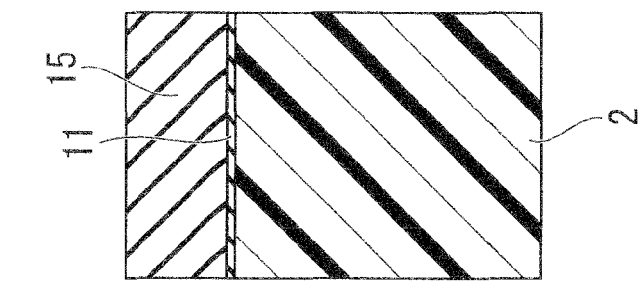
FIG. 13D
PERIPHERAL CIRCUIT REGION
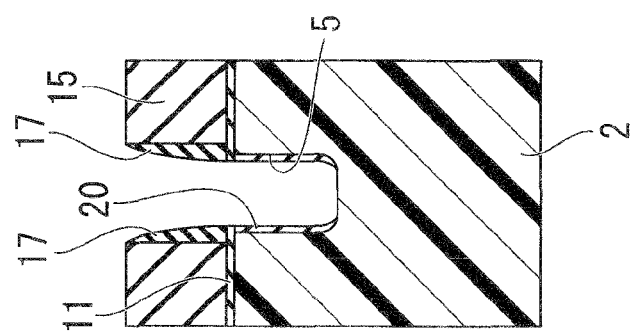
FIG. 13C
CROSS SECTION TAKEN ALONG LINE C-C'
FIG. 13B
CROSS SECTION TAKEN ALONG LINE B-B'
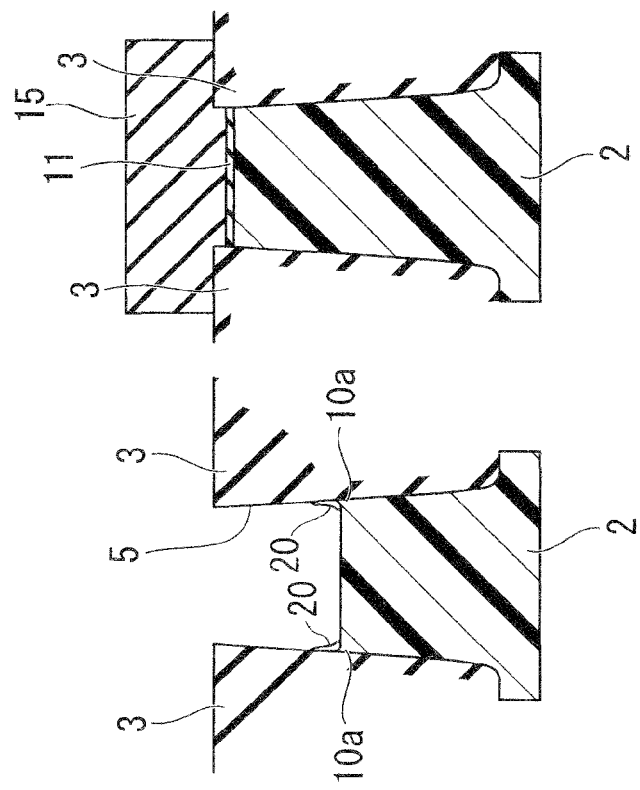
FIG. 13A
CROSS SECTION TAKEN ALONG LINE A-A'

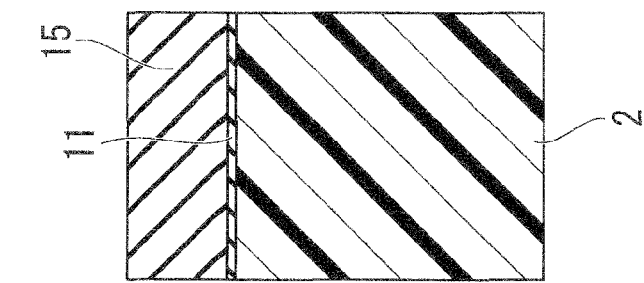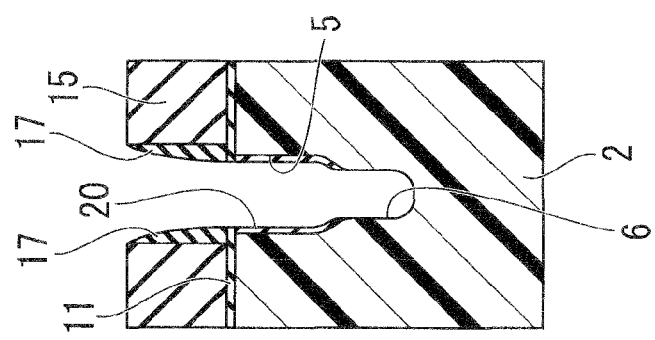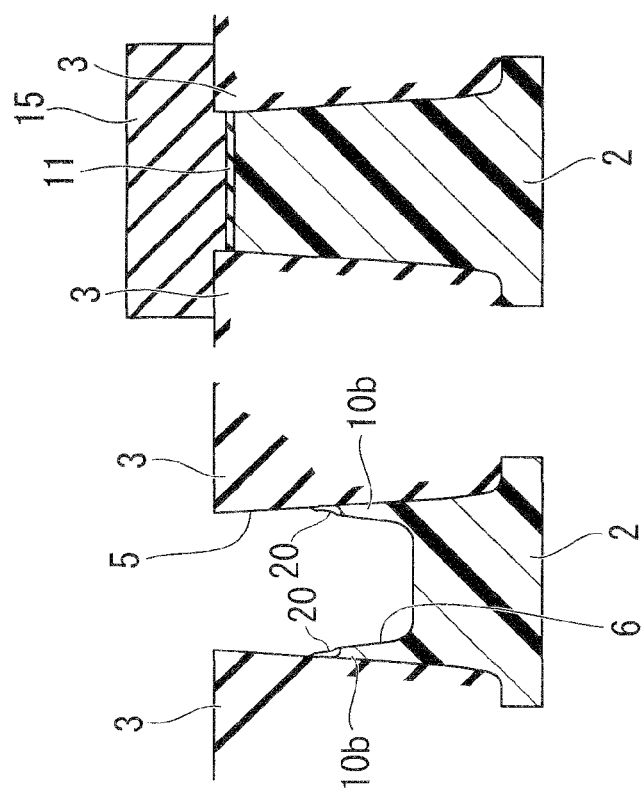

PERIPHERAL CIRCUIT REGION

CROSS SECTION TAKEN ALONG LINE C-C'

CROSS SECTION TAKEN ALONG LINE B-B'

CROSS SECTION TAKEN ALONG LINE A-A'

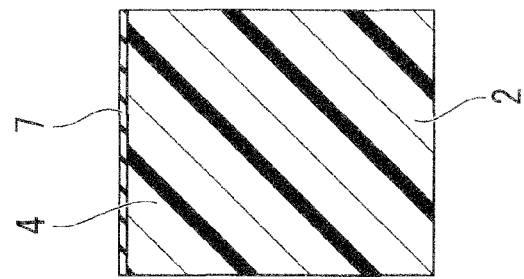
FIG. 16D
PERIPHERAL CIRCUIT REGION
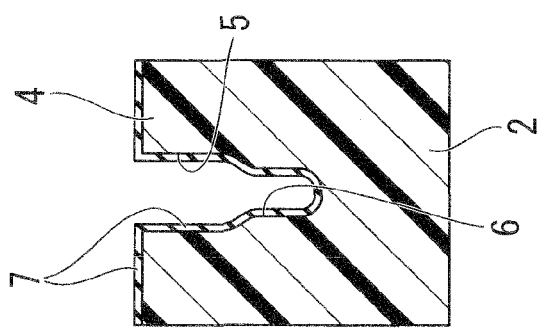
FIG. 16C
CROSS SECTION TAKEN ALONG LINE C-C'
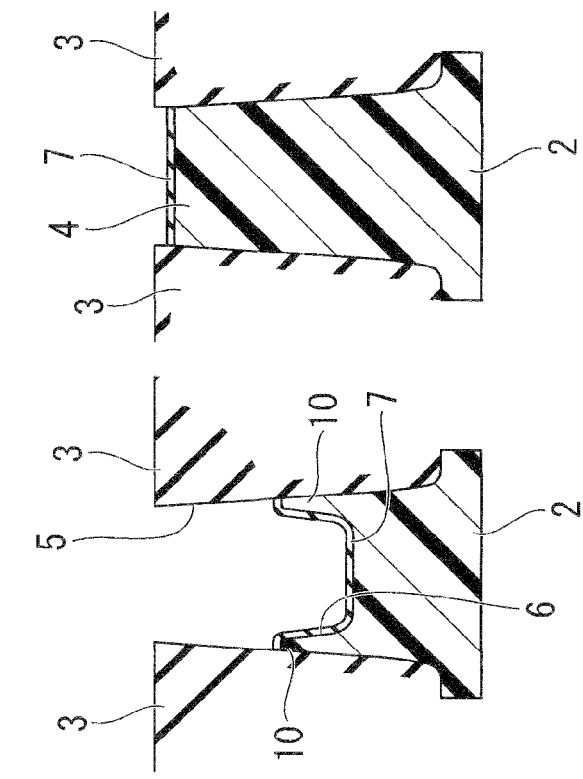
FIG. 16B
CROSS SECTION TAKEN ALONG LINE B-B'
FIG. 16A
CROSS SECTION TAKEN ALONG LINE A-A'

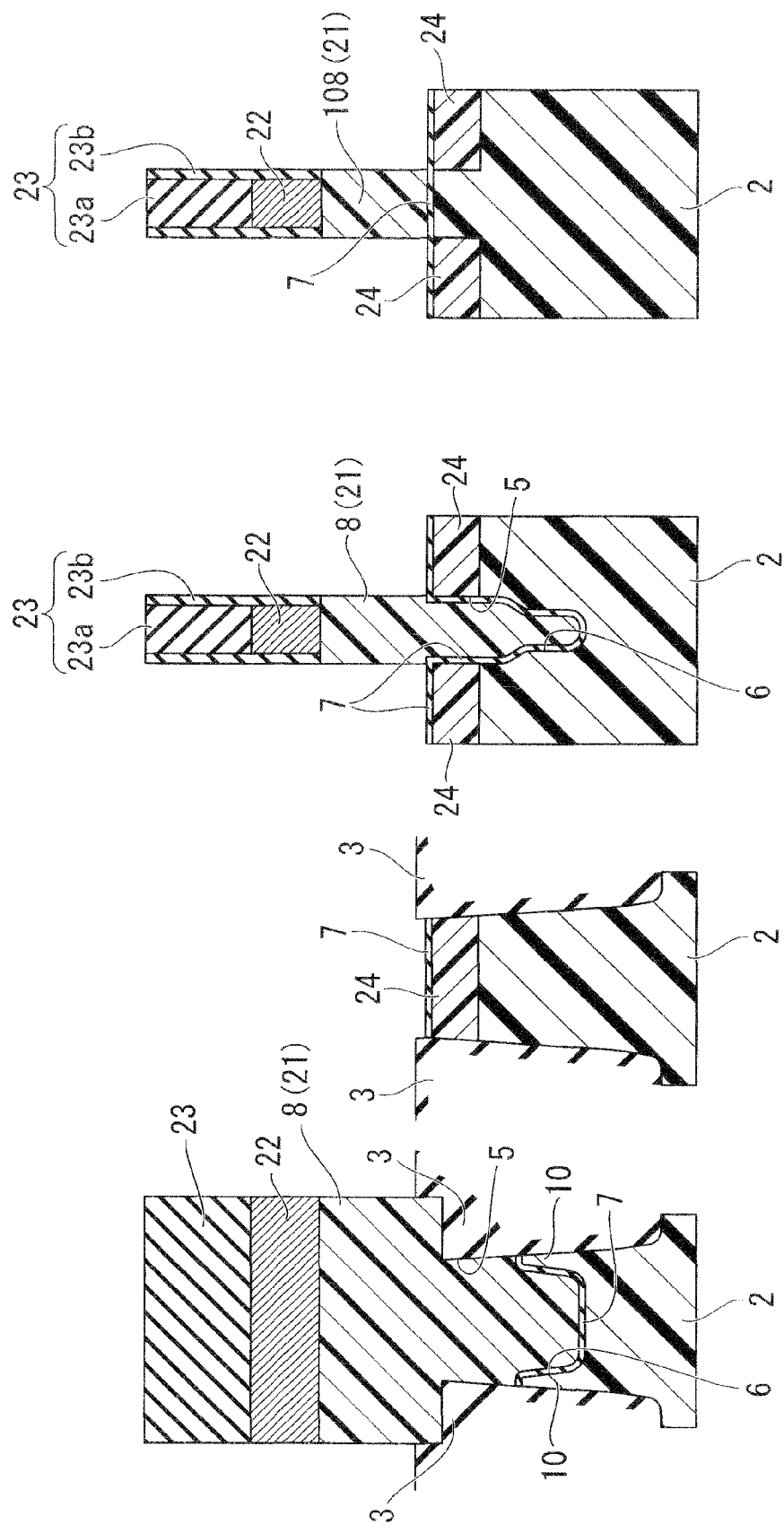

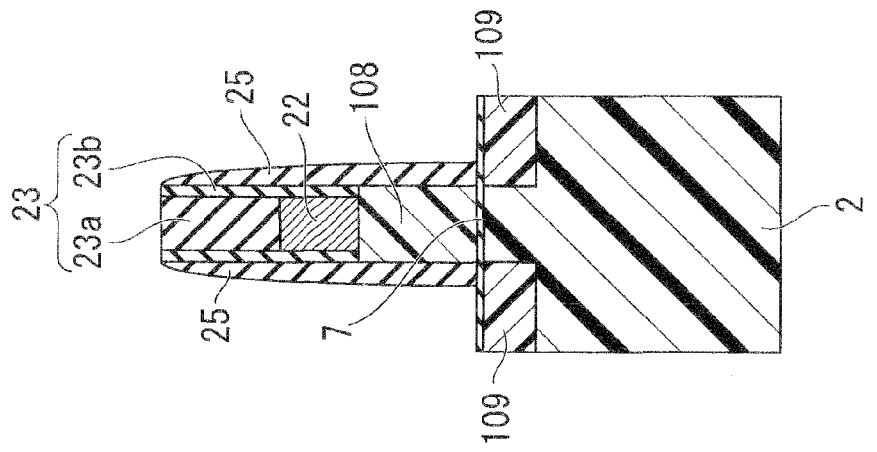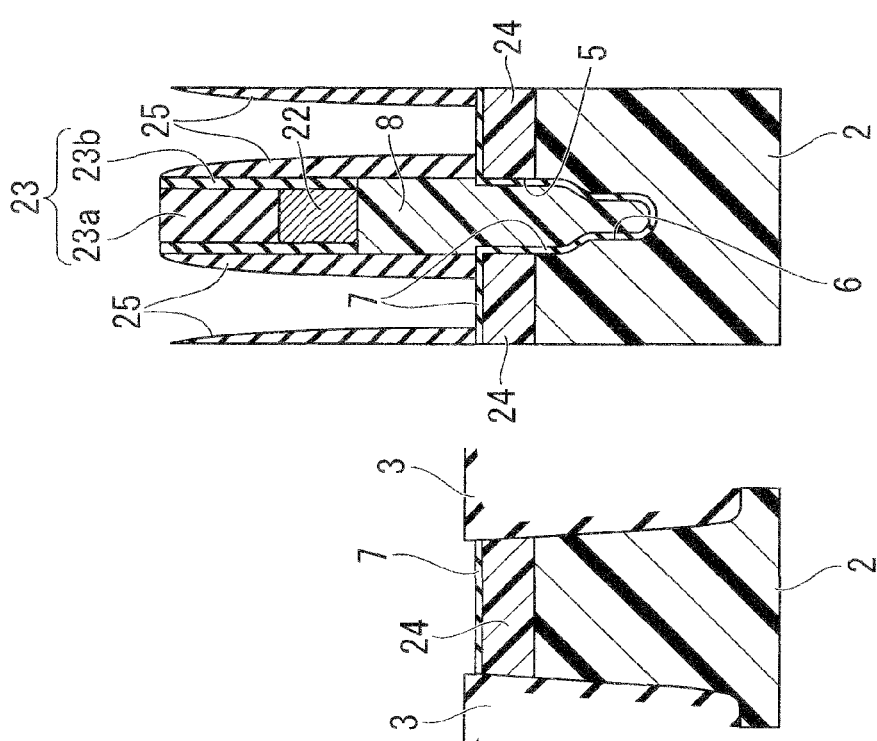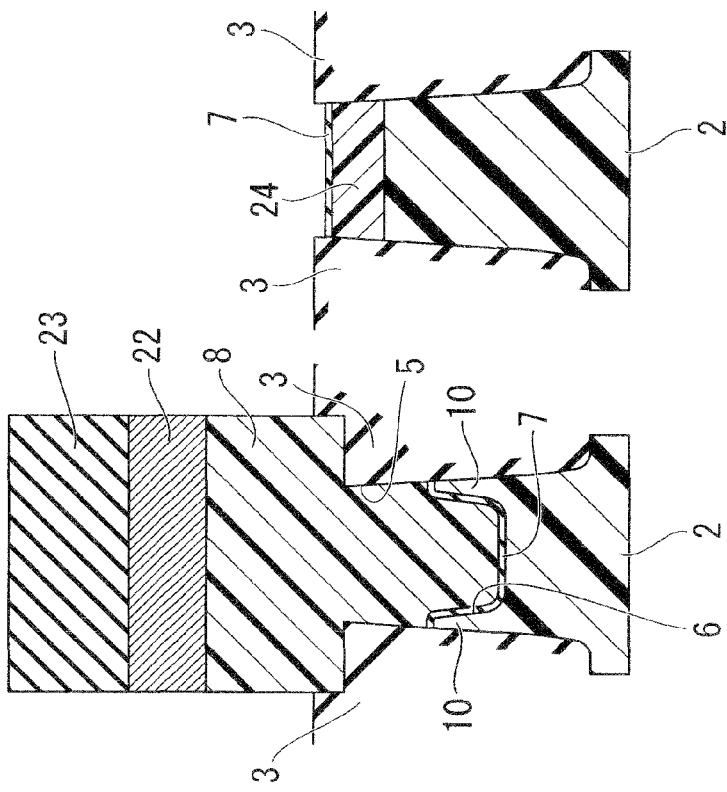

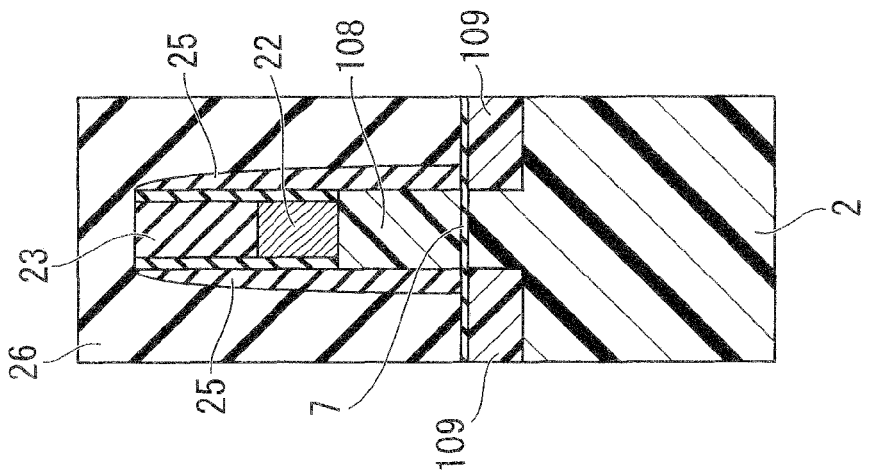
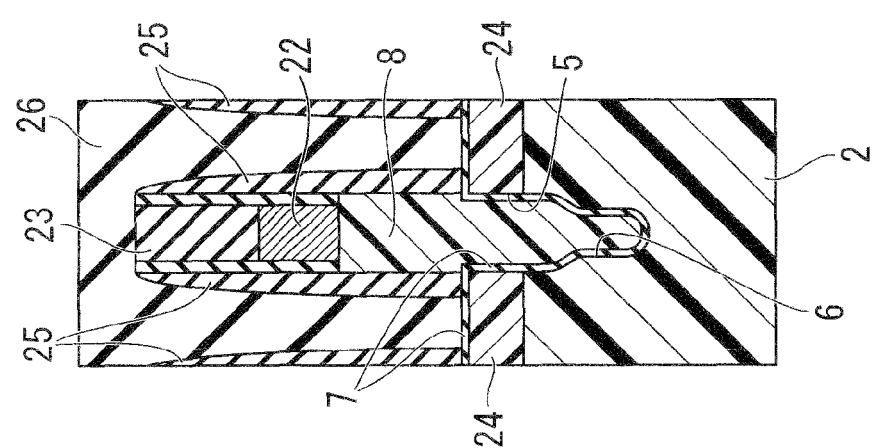
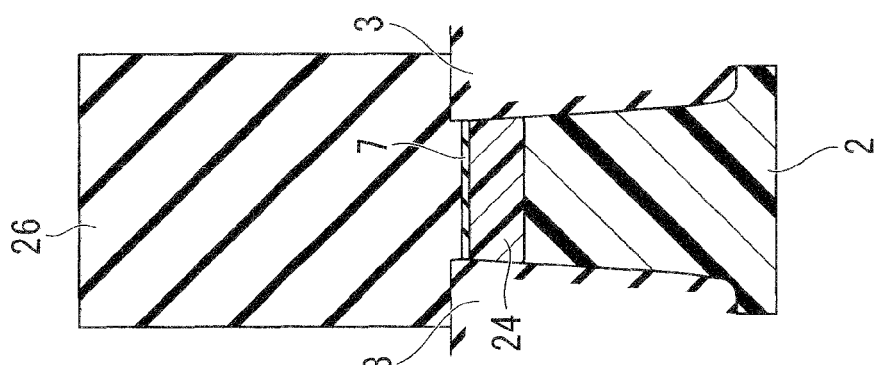
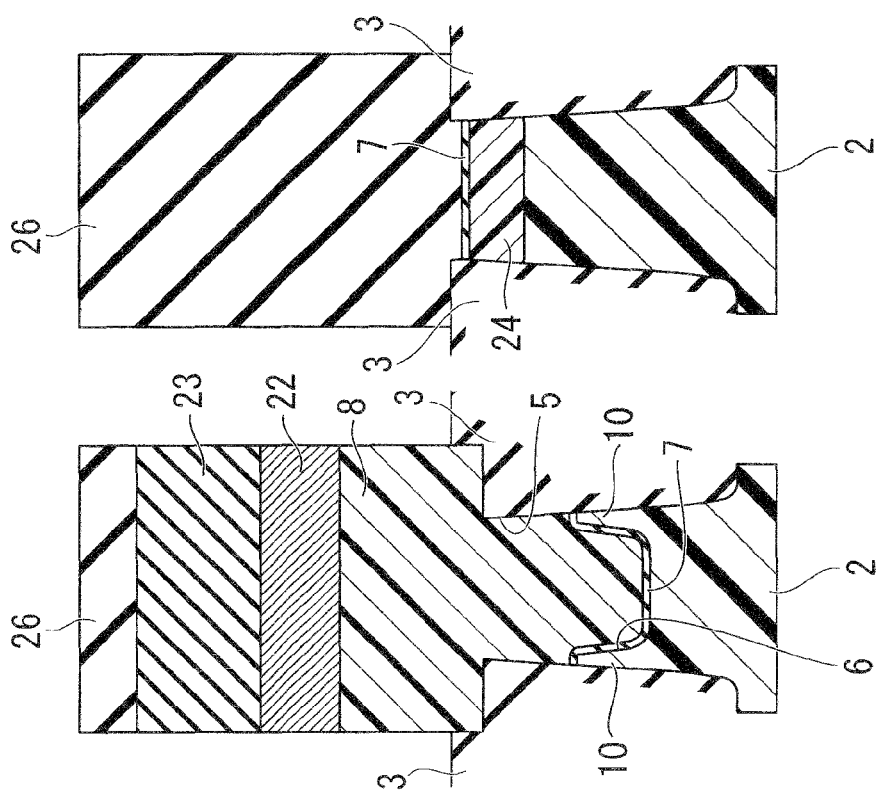

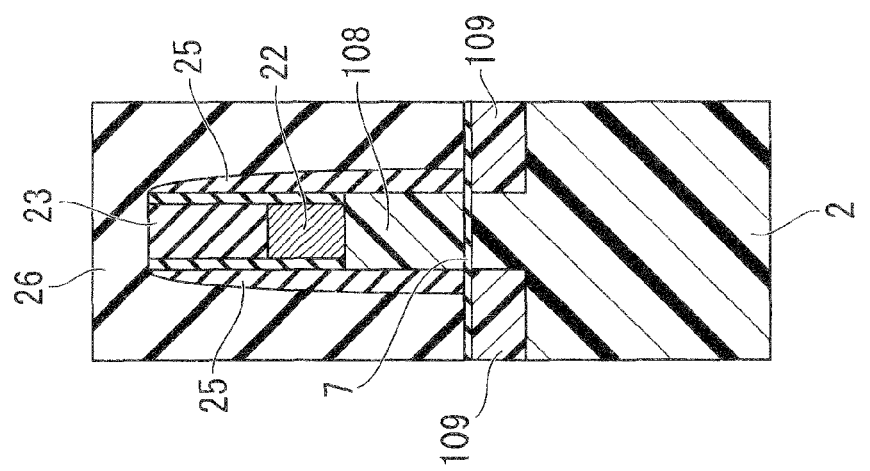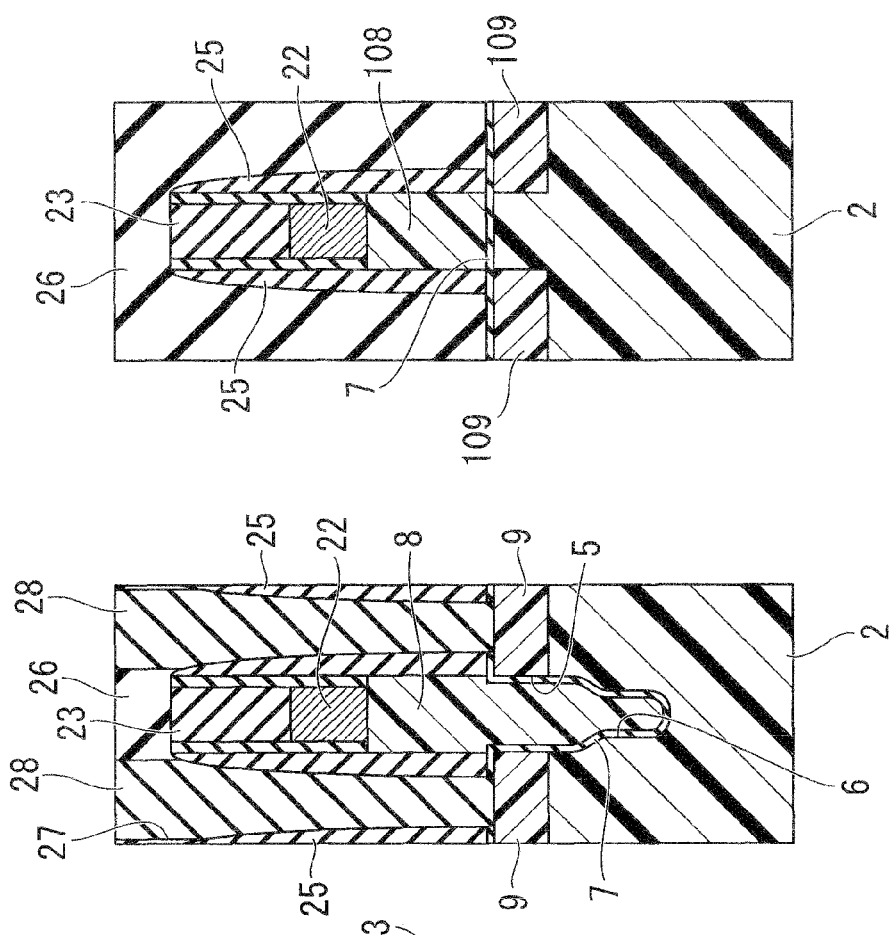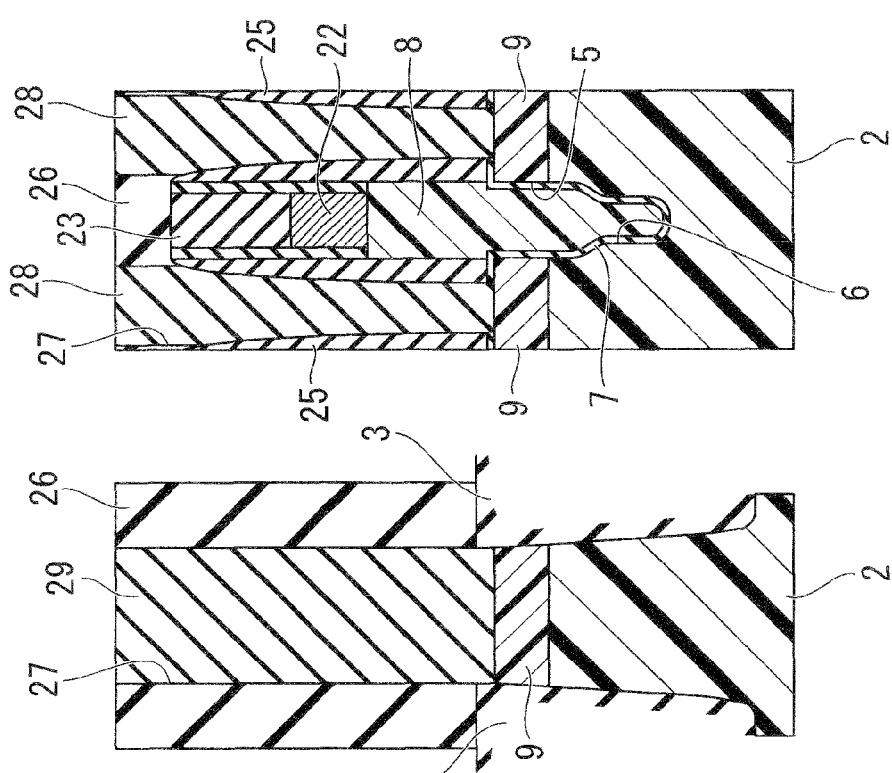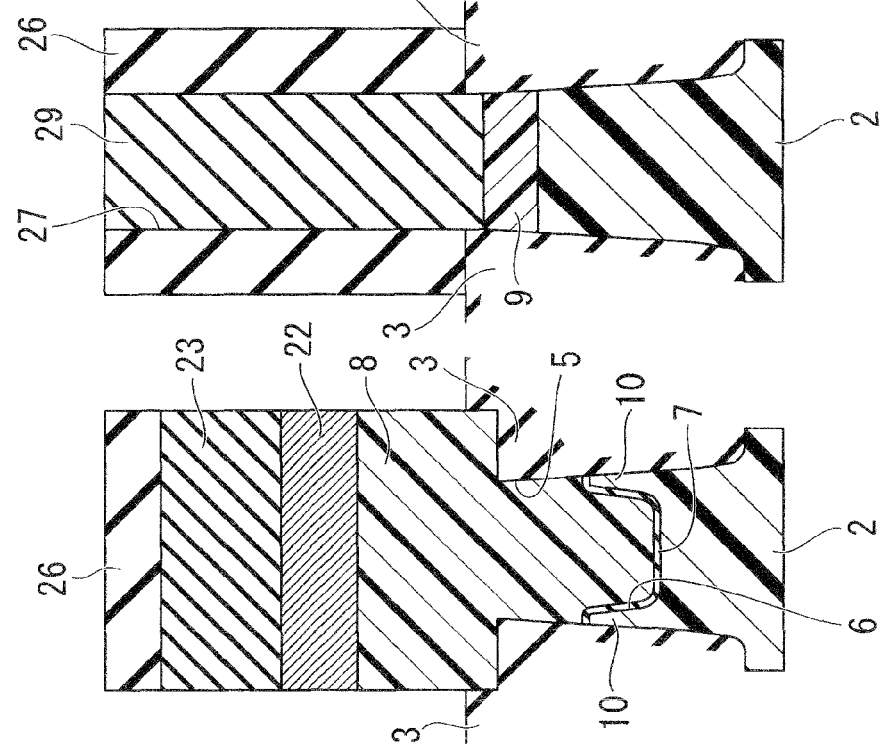

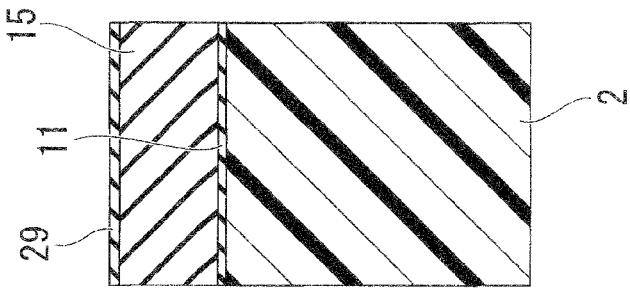
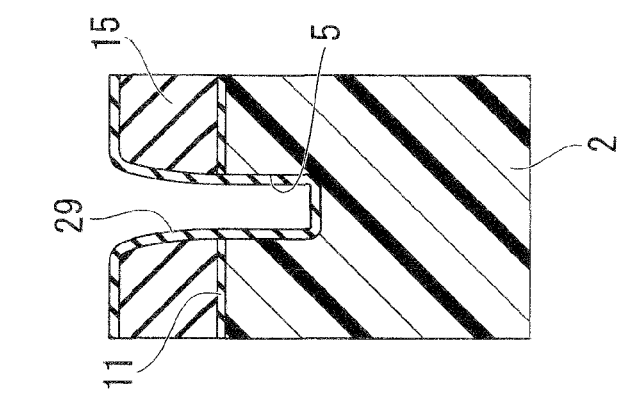
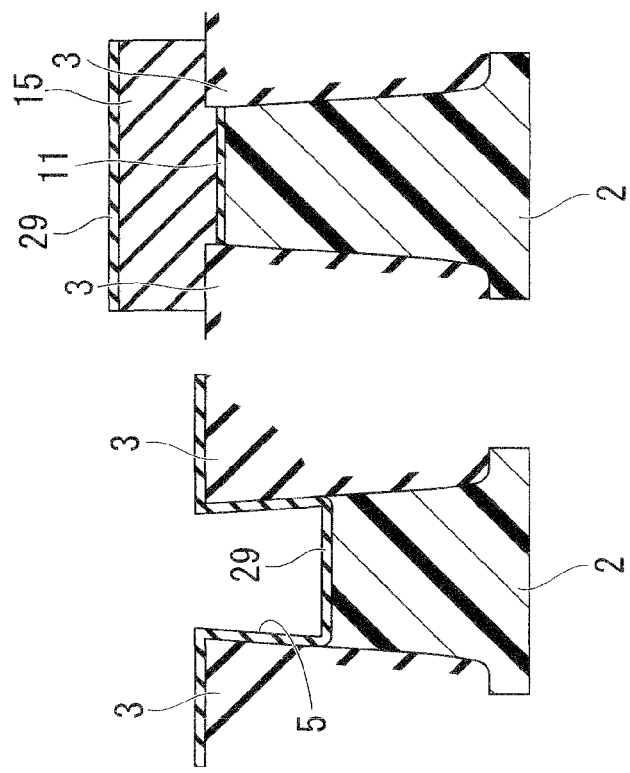

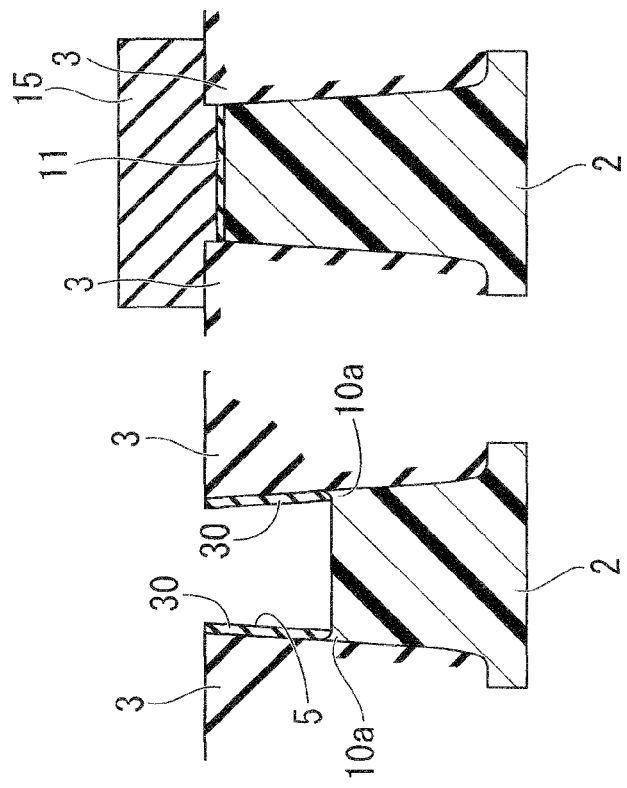
FIG. 23A CROSS SECTION TAKEN ALONG LINE A-A'
FIG. 23B CROSS SECTION TAKEN ALONG LINE B-B'
FIG. 23C CROSS SECTION TAKEN ALONG LINE C-C'
FIG. 23D PERIPHERAL CIRCUIT REGION

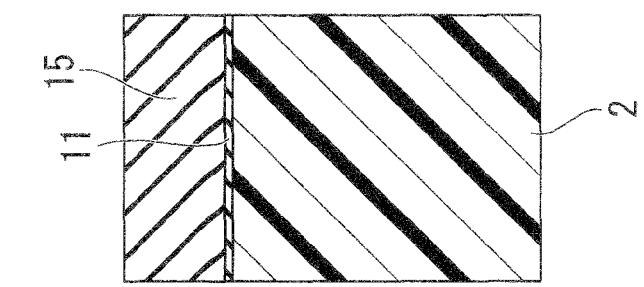
FIG. 24D
PERIPHERAL CIRCUIT REGION
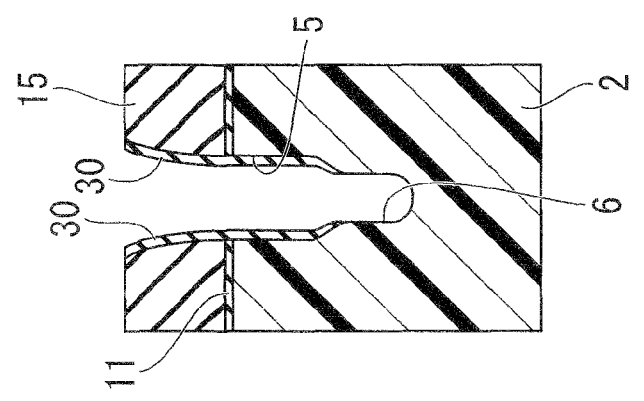
FIG. 24C
CROSS SECTION TAKEN ALONG LINE C-C'
FIG. 24B
CROSS SECTION TAKEN ALONG LINE B-B'
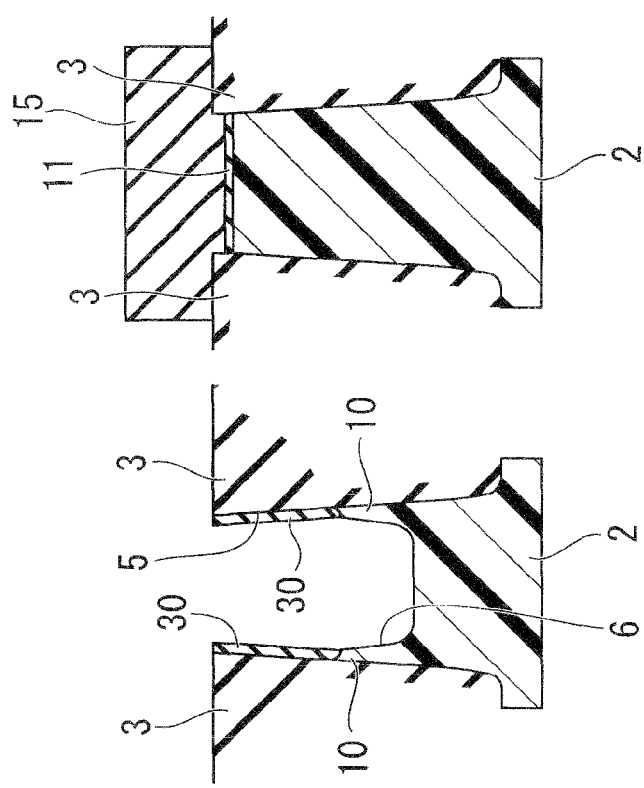
FIG. 24A
CROSS SECTION TAKEN ALONG LINE A-A'

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

Priority is claimed on Japanese Patent Application No. 2008-210556, filed Aug. 19, 2008, the content of which is incorporated herein by reference.

2. Description of the Related Art

Recently, gate lengths of MOS (Metal Oxide Semiconductor) transistors are shorter and shorter as semiconductor devices, such as a DRAM (Dynamic Random Access Memory), are further miniaturized. Accordingly, a great amount of substrate current flows which cannot be controlled by a gate. In other words, short-channel effects have been becoming more problematic.

In an MOS transistor used for a cell array transistor DRAM, a concentration of an impurity included in a channel region is increased to prevent such a short channel effect. However, an electric field around an S/D junction increases as a concentration of an impurity included in the channel region increases, thereby degrading refresh characteristics.

To prevent degradation of the refresh characteristics, a technology of lengthening an effective gate length by using a three-dimensional channel structure called a trench gate transistor or a recess channel transistor has been developed. Accordingly, the short channel effect can be prevented without increasing an impurity concentration, thereby preventing degradation of the refresh characteristics.

However, an increase in junction leakage current or gate voltage has been problematic though the short channel effect can be prevented.

Japanese Patent Laid-Open Publication No. 2007-158269 discloses a semiconductor device and a method of manufacturing the same. In the semiconductor device, a gate trench is formed in an active region, fin-shaped silicon thin films are formed on the sidewalls of the STI (Shallow Trench Isolation), and thereby the fin-shaped silicon thin films are used as channels in such a semiconductor device, a three-dimensional SOI channel is used as a cell array transistor, thereby decreasing the threshold voltage, enhancing the characteristics of wiring to the capacitor, and partially achieving the characteristics of a fully-depleted transistor.

However, in the method of manufacturing the three-dimensional SOI channel disclosed in the above related art, it is difficult to form the fin-shaped SOI channel with high precision and reproducibility since the fin-shaped SOI chapel is formed by processing the gate trench using a mask used for the formation of the STI. Consequently, a fluctuation in the shape of the fin-shaped SOI channel (such as in the height or width) causes a fluctuation in the transistor characteristics. Additionally, a fully-depleted fin-shaped SOI channel extending from a bottom surface of the gate trench up to a surface of a semiconductor substrate causes an increase in current flowing between the source and the drain. For this reason, it is difficult to control the threshold voltage of the transistor.

SUMMARY

In one embodiment, there is provided a method of manufacturing a semiconductor device. The method includes the following processes. A first gate trench is formed in a semiconductor substrate region. Then, a first insulating film is formed to cover bottom and side surfaces of the first gate trench. Then, the first insulating film is removed to cover the bottom surface. Then, the semiconductor substrate region exposed to the first gate trench is etched by the first insulating film covering the side surfaces as a mask, to form, in the semiconductor substrate region, a second gate trench directly below the first gate trench. The second gate trench is defined by an unetched film portion of the semiconductor substrate region. The unetched film portion extends toward one of the side surfaces of the first gate trench.

In another embodiment, there is provided a semiconductor device that includes: a semiconductor substrate having an isolation region and an active region defined by the isolation region; a first gate trench in the active region; and a second gate trench in the active region. The second gate trench is directly below the first gate trench. The second gate trench is defined by a semiconductor film which is a portion of the semiconductor substrate extending toward a side surface of the first gate trench.

Accordingly, a thickness and a height of the silicon thin film forming the channel can be controlled with high precision and reproducibility. Therefore, a threshold voltage of the semiconductor device can be controlled, and fluctuations in characteristics of the semiconductor device can be reduced.

BRIEF DESCRIPTION OF THE DRAWINGS

The above features and advantages of the present invention will be more apparent from the following description of certain preferred embodiments taken in conjunction with the accompanying drawings.

FIG. 2A is a perspective view illustrating a trench gate FET of the present invention.

FIG. 2B is a perspective view illustrating a silicon thin film.

FIGS. 3A to 20D are cross-sectional views indicative of a process flow illustrating a method of forming a DRAM according to a first embodiment of the present invention.

FIG. 21(*b*) illustrates the characteristic profile of a conventional trench gate FET.

FIGS. 22A to 24D are cross-sectional views indicative of a process flow illustrating a method of forming a DRAM according to a second embodiment of the present invention.

DETAILED DESCRIPTION OF THE PREFERRED EMBODIMENTS

The invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention ad that the invention is not limited to the embodiments illustrated herein for explanatory purposes.

First Embodiment

A first embodiment of the present invention explains the case where the present invention is applied to a trench gate FET (Field Effect Transistor) in a DRAM memory cell array.

Figure 1A:
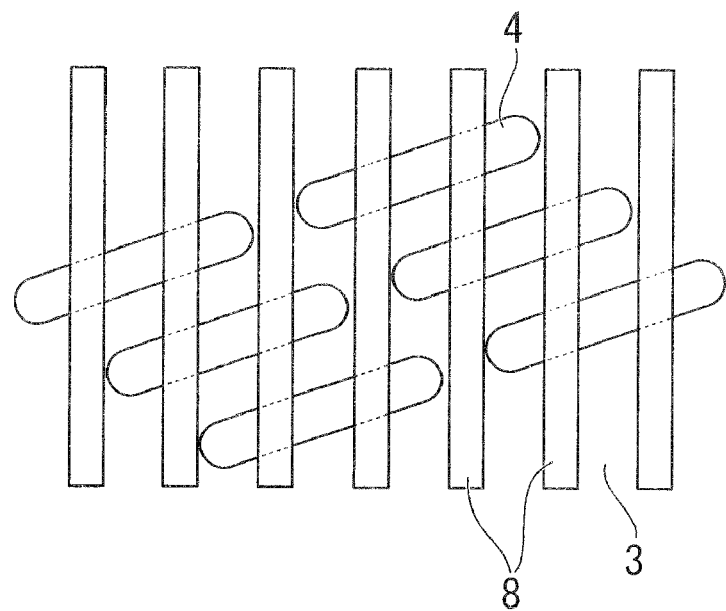
FIG. 1A is a plane view illustrating a layout of a DRAM cell array.
Figure 1B:
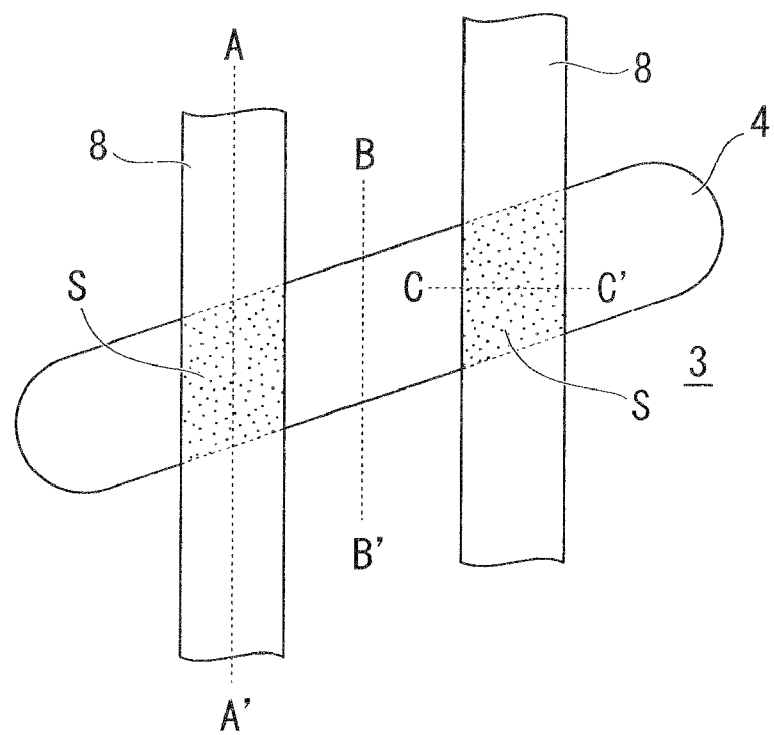
FIG. 1B is an enlarged view illustrating a region in which a trench gate is formed.
Figure 5A:
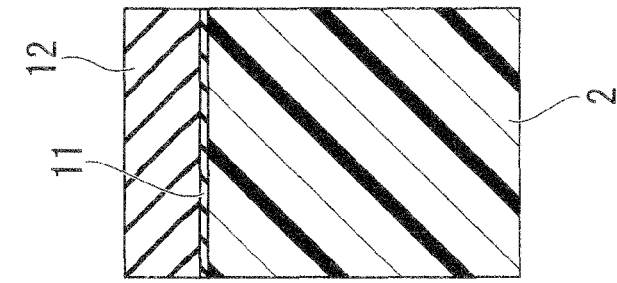
Figure 5B:
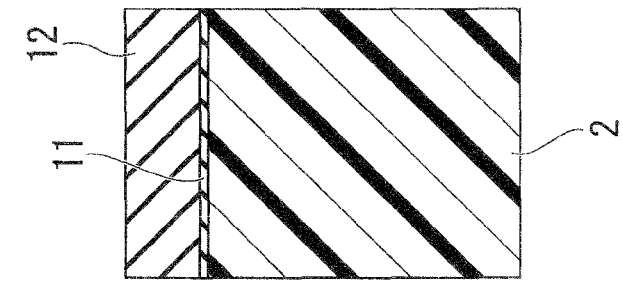
Figure 5C:
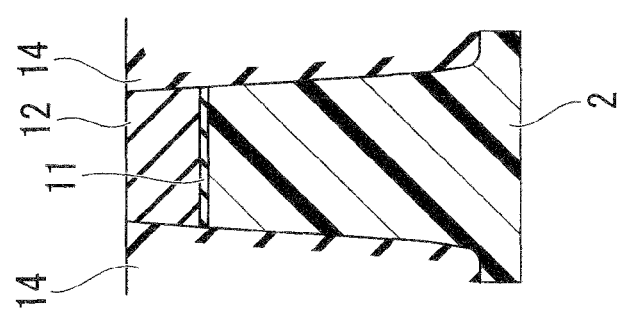
Figure 5D:
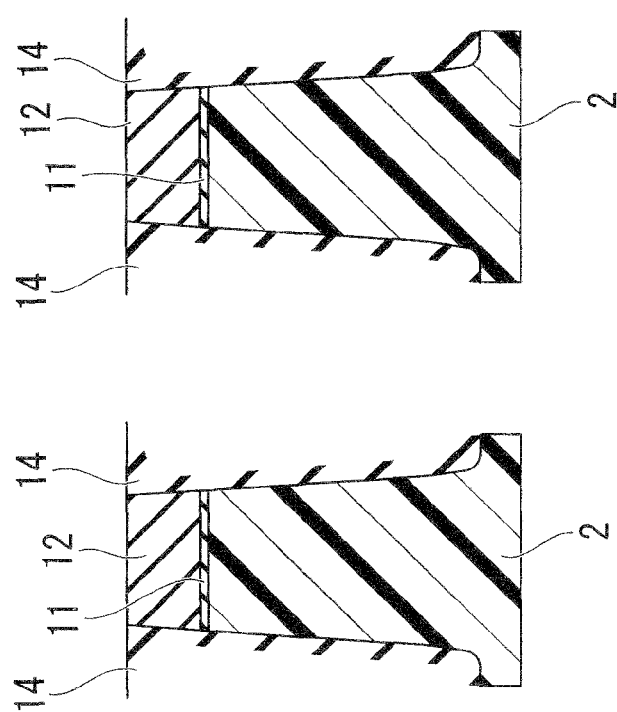
Figure 6A:
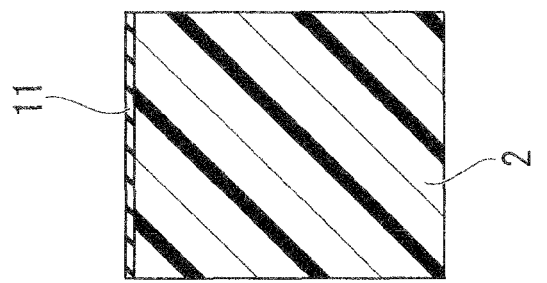
Figure 6B:
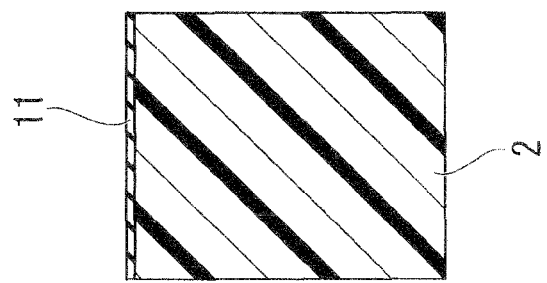
Figure 6C:
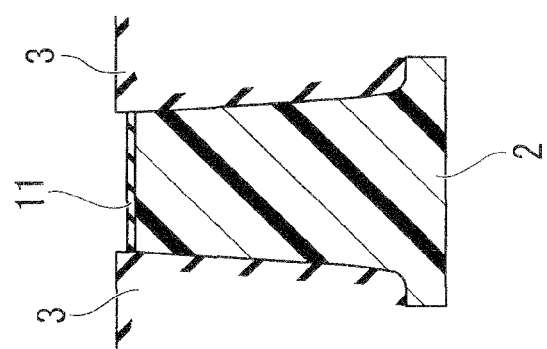
Figure 6D:
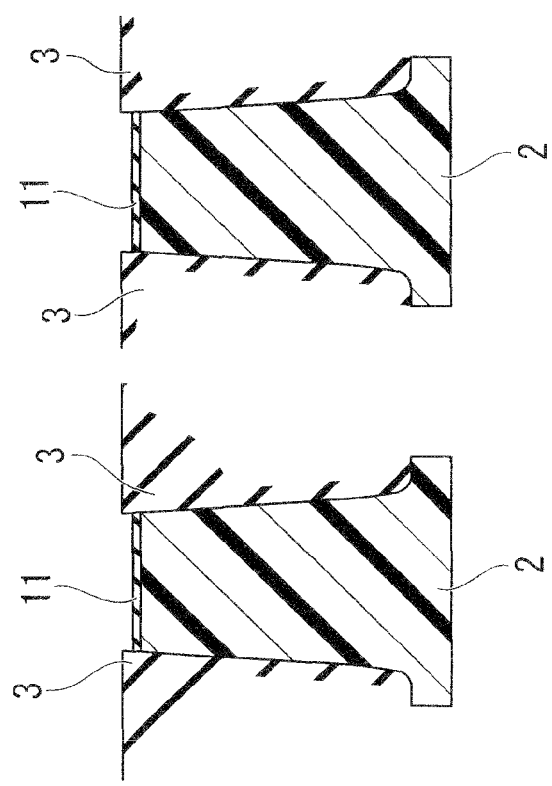
Figure 15D:
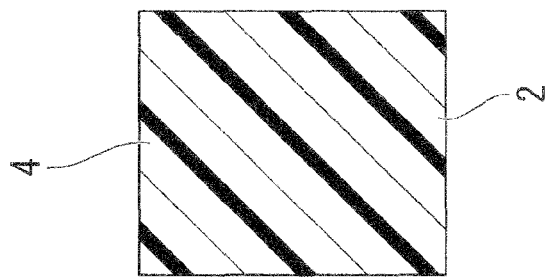
Figure 15C:
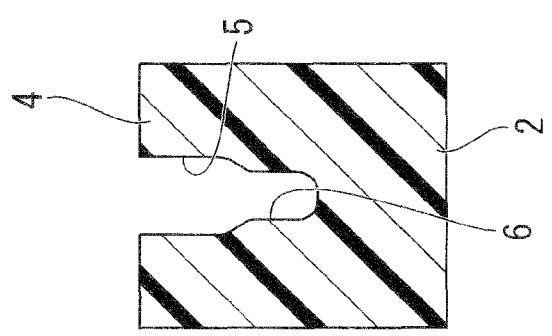
Figure 15B:
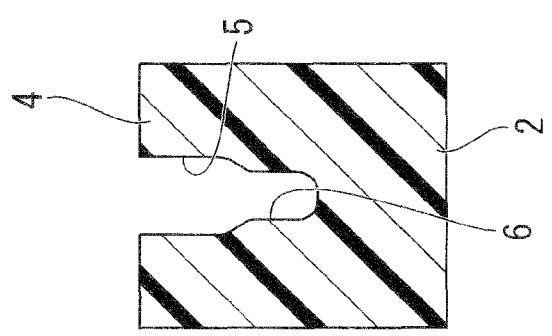
Figure 15A:
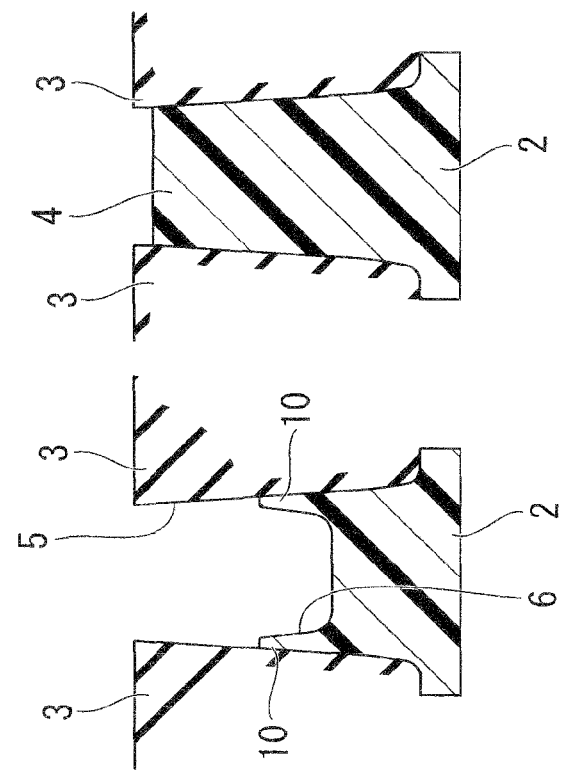

In a DRAM memory cell as shown in FIG. 1A, active regions 4 are defined by an STI region 3. Gate electrodes 8 which will be word lines are formed across the active regions 4. As shown in FIG. 1B a cross region where the active region 4 crosses the gate electrode 8 is a trench gate formation region S. As shown in FIG. 2A, a trench gate FET 1 is formed in the trench gate formation region S.

The trench gate FET 1 includes: a semiconductor substrate 2 having a surface layer including silicon; an STI region 3 made of an insulating film embedded in the semiconductor substrate 2; an active region 4 defined by the STI region 3; a first gate trench 5 formed in the active region 4; a second gate trench 6 directly below the first gate trench 5; a gate electrode 8 embedded into the first and second gate trenches 5 and 6 with an intervention of a gate insulating film 7; and S/D (Source/Drain) regions 9 formed by implanting an ion into the active region 4 on both sides of the first gate trench 5.

The S/D regions 9 are shallower than a bottom portion of the first gate trench 5. Silicon thin films 10 are formed between the second gate trench 6 and the STI region 3 and will be channels of the trench gate FET1.

Specifically, the silicon thin film 10 is formed perpendicularly to the semiconductor substrate 2 and a height of which is from the bottom level of the second gate trench 6 to the bottom level of the first gate trench 5, as shown in FIGS. 2A and 2B. In other words, the height and a width of the silicon thin film 10 are the same as those of the second gate trench 6. Preferably, a thickness of the silicon thin film 10 is 10 nm to 30 nm and a height thereof is 40 nm to 70 nm. The thickness of the silicon thin film 10 is a horizontal dimension which is an average thickness at a middle portion between the upper and lower levels of the second gate trench 5. The STI region 3 and the gate insulating film 7 are not shown in FIG. 2B.

The trench gate FET1 further includes: a sidewall spacer covering both side surfaces of the gate electrode 8; a hard mask deposited over the gate electrode 8; an inter-later insulating film covering the gate electrode 8 and the S/D regions 9, and a contact plug embedded into a contact hole formed in the inter-later insulating film, thus forming a DRAM cell transistor. Further, peripheral transistors, bit and word lines, capacitor contact plugs, capacitors, wires, and the like are provided in the DRAM. The sidewall spacer, the hard mask, the inter-later insulating film, the contact plug, and the source and drain electrodes are not shown in FIGS. 2A and 2B.

Thus, the silicon thin films 10 become channels in the trench gate FET1 when the potential difference between the source and drain regions exceeds a threshold.

Hereinafter, a method of manufacturing a DRAM including the trench gate FET1 according to the first embodiment is explained with reference to FIGS. 3 to 20 illustrating a process flow of the method. FIGS. 3A to 20A are cross-sectional views taken along a line A-A' shown in FIG. 1B. FIGS. 3B to 20B are cross-sectional views taken along a line B-B'. FIGS. 3C to 20C are cross-sectional views taken along a line C-C'. FIGS. 3D to 20D are cross-sectional views of a transistor used as a peripheral circuit.

First, the STI region 3 is formed in the semiconductor substrate 2, and thereby multiple active regions 4 are defined by the STI region 3 in the cell array region.

Specifically, a pad oxide film 11 made of a silicon oxide film and a field nitride film 12 made of a nitride film are sequentially deposited over the semiconductor substrate 2 made of silicon. In an example of the first embodiment, the pad oxide film 11 having a thickness of approximately 9 nm and the field nitride film 12 having a thickness of approximately 120 nm are formed by thermal oxidation and LP-CVD (Low Pressure-Chemical Vapor Deposition), respectively.

The field nitride film 12 is used as a mask layer covering the active regions 4 (see FIG. 1A) and also used as a CMP stopper of an embedded insulating film made of, for example, a silicon oxide film when the STI region 3 is formed as explained later.

Then, a patterning is carried out using lithography and dry etching. Specifically, the field nitride film 12 and the pad oxide film 11 are patterned into a pattern of the active regions 4 as shown in FIG. 1A, and the remaining parts of the field nitride film 12 and the pad oxide film 11 are etched (FIGS. 3A to 3D).

Then, the semiconductor substrate 2 is dry etched with the field nitride film 12 as a mask, as shorten in FIGS. 4A to 4D. Thus STI trenches 13 which will be the STI region 3 are formed in the semiconductor substrate 2. In the example of the first embodiment, the STI trench 13 having a depth of approximately 200 nm is formed. At this time, the field nitride film 12 is also etched by approximately 50 nm, and the thickness of the field nitride film 12 after the etching becomes approximately 70 nm.

In the example of the first embodiment, a surface layer of the semiconductor substrate 2 includes silicon. A mixed gas plasma including hydrogen bromide, chlorine, and oxygen is used for dry etching the silicon. In this case, gas supply, especially oxygen supply, is adjusted during the dry etching to make the side surfaces of the STI trench 13 (i.e., the side surfaces of the STI region 3) sloped. The slope is provided for reducing stress applied to the insulating film embedded into the STI region 3 and preventing degradation in characteristics of a transistor to be formed in the active region. Specifically, the trench 13 is formed such that the side surface of the STI region 3 is inclined toward the semiconductor substrate 2 by approximately 3° to 10° with respect to the vertical direction.

Then, a silicon oxide film 14 is formed to be embedded in the STI trenches 13. Then, a surface of the silicon oxide film 14 is planarized by CMP (Chemical Mechanical Polishing) with the field nitride film 12 as a stopper until the surface of the field nitride film 12 is exposed, as shown in FIGS. 5A to 5D. In the example of the first embodiment, the silicon oxide film 14 is formed by HDP-CVD (High Density Plasma-Chemical Vapor Deposition).

Then, the silicon oxide film 14 is wet-etched after the CMP to adjust a height of the silicon oxide film 14, followed by wet etching to remove the field nitride film 12, as show a in FIGS. 6A to 6D. Thus, the STI region 3 is formed. In this case, the height of the STI region 3 is adjusted to be higher by approximately 25 nm than the height of the semiconductor substrate 2. This height difference finally becomes approximately 10 nm through a clearing process and a wet etching process which are explained later.

Although not shown, ion implantation is carried out after the formation of the STI region 3 to form well and channel regions of transistors included in the cell and peripheral regions, followed by a thermal treatment for activation.

Then, a silicon nitride film is deposited over the pad oxide film 11 and the STI region 3 to form a trench mask 15 as shown in FIGS. 7A to 7D. The trench gate mask 15 is a mask for forming the first gate trench 15. In the example of the first embodiment, the trench gate mask 15 having a thickness of approximately 120 nm is formed.

Then, a resist film is formed over the trench gate mask 15, and then the resist film is patterned by lithography to form a resist pattern 16 having a shape corresponding to that of the first gate trench 5, as shown in FIG. 8. At this time, a mask made of the resist pattern 16 is formed except on the cross-section shown in FIG. 8A and on a part of the cross-section shown in FIG. 8C.

Then, the trench gate mask 15 is dry-etched with the resist pattern 16 as a mask, as shown in FIG. 9. In the dry etching of the trench gate mask 15, the pad oxide film 11 made of the silicon oxide film serves as a stopper. In the dry etching of the trench gate mask 16 made of the silicon nitride film, anisotropic dry etching using mixed gas plasma including tetrafluorocarbons ($CF_4$) and trifluoromethane ($CHF_3$) is used. In the anisotropic dry etching using the gas plasma, the etching rate of the trench gate mask 15 with respect to that of the pad oxide film 11 is greater than 5. For this reason, the pad oxide film 11 serves as a stopper for the etching of the trench gate mask 15.

Then, a silicon nitride film having a thickness of approximately 20 nm is formed, and then the formed silicon nitride film is etched to form a sidewall 17 on the trench gate mask 15, as shown in FIG. 10. The sidewall 17 is formed to narrower a width of a recess formed in the trench gate mask 15 shown in the cross-section taken along the line C-C' in FIG. 10C. In the example of the first embodiment, the width of a recess 18 between the sidewalls 17 is approximately 20 nm.

Then, the semiconductor substrate 2 is dry etched with the side walls 17 as a mask to form the first gate trench 5, as shown in FIG. 11. In the example of the first embodiment, the first gate trench 5 is formed by dry etching the pad oxide film 11 exposed to the recess 18, and then dry etching the semiconductor substrate 2 by approximately 80 nm. This dry etching is carried out using mixed gas plasma including at least chlorine ($Cl_2$) and hydrogen bromide (HBr).

The side surface of the STI region 3 is inclined toward the semiconductor substrate 2 by approximately 3° to 10° with respect to the vertical direction. For this reason, the silicon thin films 10a are formed at the same time with the first gate trench 5 as shown in the cross section taken along the line A-A' of FIG. 11A. Each of the silicon thin films 10a has a height of approximately 20 nm and is in contact with the side surface of the STI region 3. The height of the silicon thin film 10a is from the upper surface of the semiconductor substrate 2 to an upper end of the silicon thin film 10a.

The upper end of the silicon thin film 10a that will form a fin-shaped channel later can be determined by the dry etching to form the first gate trench 5. Since a correlation between dry etching conditions and a silicon etching rate can be precisely calculated, the first gate trench 5 having a desired depth call be formed with high precision and reproducibility by controlling a dry etching time. Although a great number of the first gate trenches 5 are formed in the semiconductor substrate 29 the cross-sectional area of each first gate trench 5 is constant, and therefore all the first gate trenches 5 having a desired depth can be collectively formed. In other words, upper ends of multiple silicon thin films 10a which will form fin-shaped channels of the trench gates FET1 can be collectively formed with high precision and high reproducibility.

Then, a silicon oxide film 19 is formed on inner side surfaces of the first gate trench 5 and a surface of the semiconductor substrate 2, as shown in FIG. 12. In the example of the first embodiment, the silicon oxide film 19 having a thickness of approximately 10 nm is formed on the inner side surfaces of the first trench 5 by thermal oxidation. Preferably, a mixed gas including oxygen and dichloroethylene ($C_2H_2Cl_2$) is used for the thermal oxidation. By the thermal oxidation using a gas including the dichloroethylene, the silicon oxide film formed on an upper portion of the inner side surface of the first gate trench 5 can be thicker than that formed on a lower portion of the inner side surface. The silicon oxide film 19 is used as a mask for forming the second gate trench 6 as will be explained later.

Then, the silicon oxide film 19 formed on the bottom surface of the first gate trench 5 is removed by dry etching, as shown in FIG. 13. Thus, sidewalls 20 made of the silicon oxide film are formed only on the inner side surfaces of the first trench gate 5. The silicon thin films 10a shown in FIG. 12A are covered by the sidewalls 20.

Then, the semiconductor substrate 2 is further etched with the STI region 3, the sidewalls 17, and the sidewalls 20 as masks to form the second gate trench 6, as shown in FIG. 14. In the example of the first embodiment, the second gate trench 6 is formed so as to have a depth of approximately 135 nm which is from the upper surface of the semiconductor substrate 2. This etching is an anisotropic dry etching using a mixed gas plasma including, for example, chlorine ($Cl_2$), hydrogen bromide (HBr), and oxygen ($O_2$). In the dry etching using the mixed gas plasma, the etching rate of the semiconductor substrate 2 with respect to that of the silicon oxide film can be greater than 20. Therefore, the second gate trench 6 can be formed with the sidewalls 20 having a thickness of 10 nm as masks.

At the same time with the formation of the second gate trench 6, silicon thin films 10b are formed between the STI region 3 and the second gate trench 6. The silicon thin film 10b extends in a direction perpendicular to the surface of the semiconductor substrate 2. A pair of the silicon thin films 10b is formed along the side rims of the second gate trench 6, is in contact with the STI region 3, and will become silicon thin films 10 forming a fin-shaped channel of the trench FET1.

Then, the trench gate mask 15 and the sidewalls 17 which are made of the silicon nitride film are removed by wet etching, and then the sidewalls 20 and the pad oxide film 11 are removed by wet etching, as shown in FIG. 15. Thus, the first gate trench 5, the second gate trench 6, the silicon thin film 10, and the active regions 4 defined by the STI region 3 are exposed.

Before the removal of the trench gate mask 15 and the sidewalls 17, a thermal oxide film having a thickness of approximately 8 nm is preferably formed on inner surfaces of the second gate trench 6, followed by an ion implantation for adjusting a threshold voltage (Vt) into a portion under the second gate trench 6 with the thermal oxide film as a through film. Thanks to the thermal oxide film, the silicon surface of the semiconductor substrate 2 can be prevented from being damaged by liquid used for wet etching of the nitride film.

Then, a gate insulating film 7 is formed by oxidizing the surface of the exposed active region 4, the sidewalls of the first gate trench 5, and the inner surfaces of the second gate trench 6, as shown in FIG. 16. In the example of the first embodiment, the gate insulating film 7 having a thickness of approximately 5 to 6 nm is formed by thermal oxidation.

Then, the gate electrode 8 is formed as shown in FIG. 17. Specifically, a polysilicon (polycrystalline silicon) film 21 having a thickness of approximately 70 nm is formed by, for example, CVD. At this time, an impurity, such as phosphorus or boron, may be included in the polysilicon film. Alternatively, an impurity may be implanted by an ion implantation after a non-doped polysilicon film is formed. If a polysilicon film including a great amount of boron is used as the gate electrode 8, nitrogen is preferably added in advance into the silicon oxide film to be used as the gate insulating film 7 by a plasma process. The polysilicon film 21 may be made of amorphous silicon being subjected to a thermal treatment.

After the polysilicon film 21 is formed, a tungsten nitride (WN) film having a thickness of 10 nm and a tungsten (W) film having a thickness of 50 nm are sequentially formed as a metal layer. Then, a silicon nitride film 23a having a thickness of approximately 140 nm which will be a hard mask 23, and a silicon oxide film having a thickness of approximately 80 nm are formed.

Then, the gate electrode 8 is patterned by lithography and dry etching. Specifically, a resist pattern (not shown) having a shape corresponding to that of the gate electrode 8 is formed by a resist film formed on the silicon oxide film being patterned by lithography. Then, the silicon oxide film and the silicon nitride film 23a are sequentially patterned by dry etching with the resist pattern as a mask. After the resist pattern is removed using plasma, the tungsten nitride film and the tungsten film are dry etched with the patterned silicon oxide film and the silicon nitride film 23a as masks. Thus, the W/WN film 22 is formed. After the dry etching, the silicon oxide film is also etched and removed.

Then, a silicon nitride film having a thickness of approximately 13 nm is formed over the entire surface, and then etched back. Thus, a sidewall 23b made of the silicon nitride film is formed on side surfaces of the W/WN film 22 and the silicon nitride film 23a to prevent the tungsten (W) from spreading over the semiconductor substrate 2. Then, the polysilicon film 21 is etched with the hard mask 23 including the silicon nitride film 23a and the sidewall 23b as a mask, and thereby is patterned into the gate electrode 8. Thus, the gate electrode 8 of the trench gate FET1 which is made of the polysilicon film 21 embedded into the first and second gate trenches 5 and 6 is formed in the memory cell region shown in FIGS. 17A and 17C. Additionally, a gate electrode 108 of a peripheral transistor is formed in the peripheral circuit region shown in FIG. 17D.

Then, an ion is implanted into the semiconductor substrate 2 (active region 4) with the hard mask 23 including the silicon nitride film 23a and the sidewall 23b as a mask to form a desired LDD (Lightly Doped Drain) region 24.

Then, an insulating film (silicon nitride film in this case) similar to the hard mask 23 is formed on the semiconductor substrate 2, and then the silicon nitride film is etched by an anisotropic etching. Thus, the silicon nitride film remains on both sides of the sidewall 23b and the gate electrode 8, and thus sidewall spacers 25 made of the remaining silicon nitride film are formed, as shown in FIG. 18. In the example of the first embodiment, the silicon nitride film having a thickness of approximately 40 nm is formed by LP-CVD, and thus the sidewall spacers 25 having a thickness of approximately 30 nm are formed.

Then, an ion is implanted into an S/D region 109 of the peripheral transistor in the peripheral circuit region.

Then, a first inter-layer insulating film 26 including a BPSG (Boro-Phospho Silicate Glass) and a TEOS-NSG film is formed to cover the entire surface of the semiconductor substrate 2, as shown in FIG. 19. In the example of the first embodiment, the BPSG film having a thickness of approximately 600 nm to 700 nm is formed by CVD, and then the surface of the BPSG film is planarized by a reflow process at 800° C. and a CMP. Then, the TEOS-NSG film having a thickness of approximately 200 nm is formed on the planarized TEOS-NSG film.

Then, a contact hole 27 penetrating the first inter-layer insulating film 26 and exposing the semiconductor substrate 2 is formed by dry etching, as shown in FIG. 20. The dry etching ends when the semiconductor substrate 2 is exposed.

Then, phosphorus or arsenic is implanted into the semiconductor substrate 2 (active region 4) through the contact hole 27 to form the S/D region 9. In the example of the first embodiment, the phosphorus is implanted at energy of 20 keV and at a dose of approximately $5.0 \times 10^{12}$ cm$^{-3}$. Similarly, arsenic is implanted at energy of 10 keV and at a dose of approximately $1.0 \times 10^{12}$ cm$^{-3}$. Thus, the S/D region 9 which is shallower than the bottom surface of the first gate trench 5 is formed. The silicon thin film 10 which will be a fin-shaped channel does not face the S/D region 9.

In this manner, the trench gate FET1 including the silicon thin films 10 which are formed between the STI region 3 and the second gate trench 6 and serve as channels can be formed.

After the S/D region 9 is formed, a phosphorus-doped amorphous silicon film is filled in the contact hole 27 and deposited over the first inter-layer insulating film 26. Then, only the amorphous silicon film over the first inter-layer insulating film 26 is removed to form the contact plugs 28. A concentration of an impurity included in the amorphous silicon film is $1.0 \times 10^{20}$ to $4.5 \times 10^{20}$ cm$^{-3}$.

After the contact plugs 28 are formed, a thermal treatment is carried out to activate the impurity included in the contact plugs 28. A high-melting-point metal such as W may be used for the contact plug 28. If a high-melting-point metal is used for the contact plug 28, it is necessary to form a barrier metal such as TiN between the high-melting point metal and the active region 4 of the semiconductor substrate 2. To separate the barrier metal from the surface of the semiconductor substrate 2, a silicon film is preferably formed in advance by selective epitaxial growth on the surface of the semiconductor substrate 2.

Then, contact plugs for peripheral transistors, bit lines, capacitors, wires (made of, for example, Al or Cu), and the like are formed using a known method. Thus, a DRAM having a pair of fin-shaped channels can be formed as a cell array transistor.

As explained above, according to the trench gate FET1 of the first embodiment, a pair of the silicon thin films 10 which will be channels is formed between the STI region 3 and the second gate trench 6. The position and the size (height and thickness) of the silicon thin films 10 are precisely controlled. For this reason, the trench gate FET1 can be provided in which the threshold voltage can be controlled and a fluctuation in the characteristics can be prevented.

According to the method of manufacturing the trench gate FET1 of the first embodiment, the sidewalls 20 made of a silicon oxide film are formed on the side surfaces of the first gate trench 5 after the first gate trench 5 is formed. Then, the second gate trench 6 is formed with the sidewalls 20 as masks, and thus the silicon thin films 10 are formed between the second gate trench 6 and the STI region 3. Since dry etching is used for forming the first and second gate trenches 5 and 6, the silicon thin films 10 which have a desired height and will be channels can be easily formed.

Further the sidewalls 20 are made from the silicon oxide film 19 by a thermal treatment excellent in thickness control. Then, the second gate trench 6 is formed with the sidewalls 20 as masks. Accordingly, a thickness of the sidewall 20 (silicon oxide film 19) can be precisely controlled. Therefore, thicknesses of the silicon thin films 10 can be controlled so that a desired fin-shaped channel is formed.

Accordingly, the silicon thin films 10 whose position, height, and thickness are controlled can be formed with high precision and reproducibility. Additionally, the silicon thin films 10 are formed not on the side surfaces of the first gate trench 5, but on the side surfaces of the second gate trench 6. For this reason, characteristic control, such as a threshold voltage control, is simplified. Therefore, a semiconductor device including a transistor having a reduced fluctuation in characteristics can be manufactured.

According to the method of manufacturing the trench gate FET1 of the first embodiment, the side surfaces and the bottom surfaces of the first and second gate trenches 5 and 6 are used as channels, and therefore a channel width can be secured. Thus, the channel resistance is reduced, and a current for a writing can be secured.

Additionally, since the channel regions on the side surfaces of the first and second gate trenches 5 and 6 are made thin and high, a part of the channel region can be fully depleted. For this reason, a transistor having excellent subthreshold characteristics (reduced off and improved value S) can be formed. In other words, fluctuations in Vt and S can be prevented more than in the case of the conventional trench gate.

Figure 21:
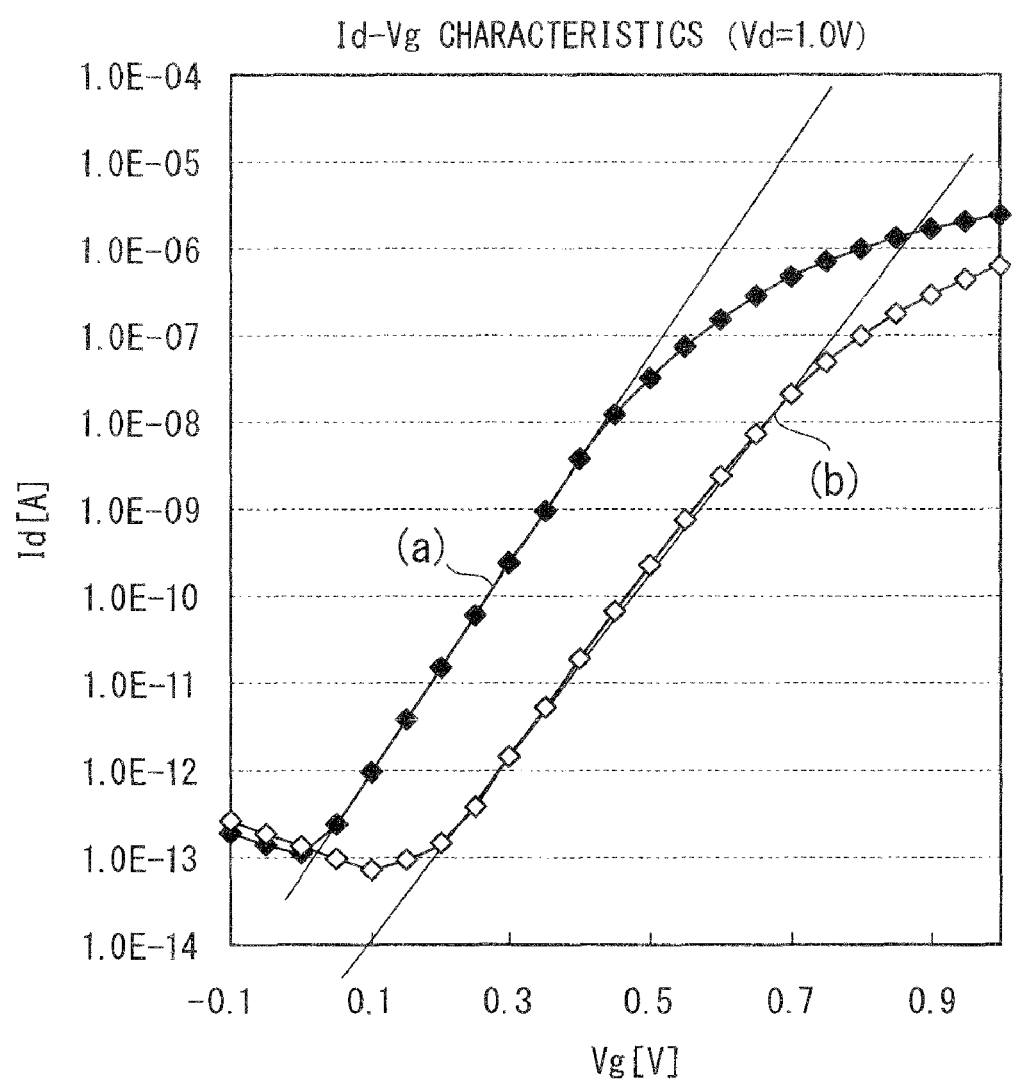
FIG. 21(*a*) illustrates the characteristic profile of a trench gate FET of the present invention.

FIG. 21 illustrates the current-voltage characteristics of a transistor formed by the method of manufacturing the semiconductor device according to the present invention. Reference character (a) denotes a characteristic profile of the transistor of the present inventions. Reference character (b) denotes a characteristic profile of the conventional trench-type transistor having no fin-shaped channel. The reference characters (a) and (b) show dependence of a drain current (Id) on a gate voltage (Vg) when a voltage of 1.0 V is applied between the source and the drain. A slope of ant approximating straight line of the characteristic profile is the subthreshold coefficient (S coefficient). The smaller the subthreshold coefficient is, the more excellent the current-voltage characteristics are.

As shown in FIG. 21, the S coefficient of the characteristic profile (a) of the present invention was 83 mV/decade, while the S coefficient of the characteristic profile (b) of the related art was 93 mV/decade. As a result, it was confirmed that the S coefficient of a transistor of the present invention is greatly improved.

Second Embodiment

Hereinafter, a method of manufacturing a semiconductor device according to a second embodiment of the present invention is explained with reference to FIGS. 22 to 24. The method according to the second embodiment is different from the method of manufacturing the trench gate FET1 according to the first embodiment. Like reference numerals denote like elements between the first and second embodiments, and explanations thereof are omitted.

In the method of manufacturing the trench gate FET1 according to the second embodiment, a silicon oxide film is formed by CVD in place of the silicon oxide film 19 which is formed by thermal oxidation and shown in FIG. 12. The processes up to the process of forming the first gate trench 5 shown in FIG. 11 in the first embodiment are the same in the second embodiment. Therefore, explanations thereof are omitted.

After the first gate trench 5 is formed, a silicon oxide film 29 having a thickness of 20 nm is deposited over the entire surface by CVD, as shown in FIG. 22. Specifically, TEOS plasma CVD, thermal CVD using monosilane ($SiH_4$) and dinitrogen monoxide ($N_2O$), thermal CVD using dichlorosilane ($SiH_2Cl_2$) and dinitrogen monoxide ($N_2O$), or the like may be used. After a thermal oxide film having a thickness of a few nanometers is formed, the silicon oxide film 29 may be deposited thereon by CVD. Since reacting molecules are vapor-deposited to form a film by CVD, silicon on the surface of the semiconductor substrate 2 is not oxidized. For this reason, the silicon oxide film 29 having a uniform thickness can be formed over the entire surface of the semiconductor substrate 2.

Then, the silicon oxide film 29 is dry etched to remove the silicon oxide film 29 on the surface of the memory cell array region and the bottom surface of the first gate trench 5, as shown in FIG. 23. Consequently, sidewalls 30 are formed on the side surfaces of the first gate trench 5.

Then, the semiconductor substrate 2 is dry etched with the sidewalls 30 as masks to form the second gate trench 6, as shown in FIG. 24. Similar to the first embodiment, for example, a mixed gas plasma including $Cl_2$, HBr, and $O_2$ may be used for the dry etching. Thus, the etching rate of the semiconductor substrate 2 made of silicon uncovered by the sidewalls 30 can be greater than that of the sidewalls 30 made of the silicon oxide film.

The following processes are similar to those of the first embodiment.

According to the method of manufacturing the semiconductor device of the second embodiment, the sidewalls 30 on the side surfaces of the first gate trench 5 are formed from the silicon oxide film 29 formed by CVD. For this reason, the sidewalls 30 can be formed up to the opening of the first gate trench 5. Accordingly, the sidewalls 30 used as a mask for dry etching to form the second gate trench 6 can be thicker, thereby further enhancing processing accuracy compared to the case of the first embodiment.

Different from the case of the oxide film 19 formed by thermal oxidation, silicon on the surface of the semiconductor substrate 2 is not consumed upon formation of the silicon oxide film 29 deposited by CVD. In other words, in the case of forming a silicon oxide film by thermally oxidizing the inner walls of the first gate trench 5 in the first embodiment, the thickness of the silicon oxide film is limited. On the other hand, in the case of forming a silicon oxide film by CVD, the thickness of the deposited silicon oxide film is not limited unless the first gate trench 5 is completely filled with the silicon oxide film. Therefore, the sidewalls 30 can be formed with a desired thickness. In other words, the thickness of the silicon thin films 10 which will be fin-shaped channels can be freely controlled.

As the sidewalls 30 are thicker, the opening width of the second gate trench 6 is narrower, and consequently the area of the bottom surface of the second gate trench 6 which will be a channel is decreased. Consequently, the silicon thin films 10 occupy a larger area of the channel, and therefore the characteristics of the trench gate FET1 become closer to that of a fully-depleted transistor. Accordingly, fluctuations in characteristic values, such as threshold voltages or S coefficients, can be further reduced.

It is apparent that the present invention is not limited to the above embodiments, but may be modified and changed without departing from the scope and spirit of the invention.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to a device equipped with the present invention.

What is claimed is:

1. A method of manufacturing a semiconductor device, comprising:
    forming a first gate trench in a semiconductor substrate region;
    forming a first insulating film covering bottom and side surfaces of the first gate trench;
    removing the first insulating film covering the bottom surface; and
    etching the semiconductor substrate region exposed to the first gate trench by the first insulating film covering the side surfaces as a mask, to form, in the semiconductor substrate region, a second gate trench directly below the first gate trench, the second gate trench being defined by an unetched film portion of the semiconductor substrate region, and the unetched film portion extending toward one of the side surfaces of the first gate trench.

2. The method according to claim 1, wherein the unetched film portion is a silicon thin film.

3. The method according to claim 1, wherein the second gate trench is smaller in width than the first gate trench.

4. The method according to claim 1, wherein a width of the active region increases as a depth of the semiconductor substrate region increases from a top level of the first gate trench to a bottom level of the second gate trench.

5. The method according to claim 1, wherein forming the first gate trench comprises:
  forming a second insulating film covering the semiconductor substrate region;
  forming an opening in the second insulating film by lithography;
  forming a sidewall covering either side of the opening; and
  etching the semiconductor substrate region with the sidewall as a mask.

6. The method according to claim 1, wherein forming the first insulating film is carried out by thermal oxidization.

7. The method according to claim 6, wherein the thermal oxidization uses mixed gas including oxygen and dichloroethylene.

8. The method according to claim 1, wherein forming the first insulating film is carried out by chemical vapor deposition.

9. The method according to claim 8, wherein the chemical vapor deposition is any one of tetraethoxysilane plasma chemical vapor deposition, thermal chemical vapor deposition using monosilane and dinitrogen monoxide, and thermal chemical vapor deposition using dichlorosilane and dinitrogen monoxide.

10. The method according to claim 1, further comprising:
  forming a third insulating film covering the side surfaces of the first gate trench and inner surfaces of the second gate trench;
  forming a gate electrode embedded into the first and second gate trenches with an intervention of the third insulating film; and
  implanting an impurity into the semiconductor substrate region to form source-and-drain regions, the first gate trench being between the source-and-drain regions.

11. The method according to claim 10, wherein a thickness of the third insulating film ranges from 5 nm to 6 nm.

12. The method according to claim 10, wherein the source-and-drain regions are shallower than a bottom level of the first gate trench.

13. A method of manufacturing a semiconductor device, comprising:
  forming a trench isolation region in a semiconductor substrate, an active region on the semiconductor substrate being defined by the trench isolation region;
  forming a mask layer over the semiconductor substrate, the mask layer including an opening which exposes a part of the active region;
  removing a part of the semiconductor substrate under the opening to form a first gate trench in the active region;
  forming a first insulating film covering a side surface and a bottom surface of the first gate trench;
  removing the first insulating film on the bottom surface of the first gate trench, and remaining the first insulating film on the side surface of the first gate trench; and
  removing a part of the semiconductor substrate under the bottom surface of the first gate trench to form a second gate trench in the active region,
  wherein a thin film portion of the semiconductor substrate is formed between a side surface of the second gate trench and a side surface of the trench isolation region.

14. The method according to claim 13, wherein the first insulating film is formed by performing a thermal oxidation of the semiconductor substrate.

15. The method according to claim 13, further comprising:
  forming a gate insulating film covering inner surfaces of the first gate trench and the second gate trench;
  forming a conductive film on the gate insulating film, the conductive film filling the first gate trench and the second gate trench; and
  removing a part of the conductive film to form a gate electrode, the conductive film being remained in the first gate trench and the second gate trench.

16. The method according to claim 13, wherein forming the mask layer comprising:
  forming a mask film over the semiconductor substrate;
  removing a part of the mask film to form a hole penetrating the mask film, the hole being located at a position corresponding to a position of the opening;
  forming a sidewall insulating film on an inner side surface of the hole, wherein the opening of the mask layer is defined by an edge of the sidewall insulating film.

17. The method according to claim 13, wherein the first insulating film is a silicon oxide film formed by a CVD method.

* * * * *